US012706055B2

(12) United States Patent
Shin et al.

(10) Patent No.: US 12,706,055 B2
(45) **Date of Patent: *Aug. 11, 2026**

(54) THIN FILM TRANSISTOR SUBSTRATE AND DISPLAY APPARATUS COMPRISING THE SAME

(71) Applicant: LG Display Co., Ltd., Seoul (KR)

(72) Inventors: SungSoo Shin, Paju-si (KR); Jungyul Yang, Paju-si (KR); Hanseok Lee, Paju-si (KR); HyeJi Jeon, Paju-si (KR); YounGyoung Chang, Paju-si (KR); WonSang Ryu, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 19/236,178

(22) Filed: Jun. 12, 2025

(65) Prior Publication Data

US 2025/0308465 A1 Oct. 2, 2025

Related U.S. Application Data

(63) Continuation of application No. 18/362,493, filed on Jul. 31, 2023, now Pat. No. 12,354,556.

(30) Foreign Application Priority Data

Aug. 12, 2022 (KR) ........................ 10-2022-0101265
Dec. 30, 2022 (KR) ........................ 10-2022-0190713

(51) Int. Cl.
*G09G 3/36* (2006.01)
*G09G 3/3266* (2016.01)
(Continued)

(52) U.S. Cl.
CPC ......... *G09G 3/3266* (2013.01); *G09G 3/3677* (2013.01); *H10D 30/6723* (2025.01); (Continued)

(58) Field of Classification Search
None
See application file for complete search history.

(56) References Cited

U.S. PATENT DOCUMENTS 12,354,556 B2 * 7/2025 Shin ...................... H10D 86/60
2024/0087487 A1 3/2024 Yamazaki et al.

FOREIGN PATENT DOCUMENTS

KR 10-2019-0061357 A 6/2019

OTHER PUBLICATIONS

United States Office Action, U.S. Appl. No. 18/362,493, filed Nov. 20, 2024, 12 pages.

* cited by examiner

*Primary Examiner* — Brian M Butcher
(74) *Attorney, Agent, or Firm* — Fenwick & West LLP

(57) ABSTRACT

Disclosed is a thin film transistor substrate comprising a substrate; a first thin film transistor on the substrate, the first thin film transistor including a first active layer and a first gate electrode; a second thin film transistor on the substrate, the second thin film transistor including a second active layer and a second gate electrode above the first active layer and the first gate electrode; a first insulating layer between the first gate electrode and the second active layer; and; and a first connection electrode connecting together the first active layer and the second active layer, the first connection electrode extending through a first contact hole in the first insulating layer and is in contact with each of the first active layer and the second active layer and a display apparatus including the same.

16 Claims, 16 Drawing Sheets

(51) Int. Cl.
*H10D 30/67* (2025.01)
*H10D 86/40* (2025.01)
*H10D 86/60* (2025.01)

(52) U.S. Cl.
CPC ......... *H10D 86/441* (2025.01); *H10D 86/481* (2025.01); *H10D 86/60* (2025.01); *G09G 2300/0408* (2013.01); *G09G 2300/0426* (2013.01); *G09G 2310/0286* (2013.01)

FIG. 20

| GIP 1B | GIP 1D |
| --- | --- |
| GIP 1A | GIP 1C |

GIP 1A GIP 1B

| GIP 1D |
| --- |
| GIP 1C |
| GIP 1B |
| GIP 1A |

FIG. 23

| Active Array | | | | |
| --- | --- | --- | --- | --- |
| GIP 1A | GIP 1B | GIP 1C | GIP 1D | |

THIN FILM TRANSISTOR SUBSTRATE AND DISPLAY APPARATUS COMPRISING THE SAME

CROSS-REFERENCE TO RELATED APPLICATIONS

This application is a continuation of U.S. patent application Ser. No. 18/362,493 filed on Jul. 31, 2023 which claims the benefit of the Republic of Korea Patent Applications No. 10-2022-0101265 filed on Aug. 12, 2022 and the Republic of Korea Patent Applications No. 10-2022-0190713 filed on Dec. 30, 2022, each of which is hereby incorporated by reference in its entirety.

BACKGROUND

Technical Field

The present disclosure relates to a thin film transistor substrate and a display apparatus comprising the same.

Description of the Related Art

Since thin film transistors can be manufactured on glass or plastic substrates, they are widely used as switching devices or driving devices for displays such as liquid crystal display apparatus or organic light emitting devices.

The display apparatus includes a plurality of pixels and a driving unit for driving the plurality of pixels. The driving unit may include a plurality of thin film transistors. In particular, since the Gate-In-Panel (GIP) structure in which the gate driver is mounted on the display panel contains a number of thin film transistors, there is a problem that the size of the bezel of the display apparatus increases due to the size of the Gate-In-Panel structure.

Therefore, in order to reduce the size of the Gate-In-Panel structure, a method of forming a large number of thin film transistors in a small area is required.

SUMMARY

The present disclosure has been made in view of the above problems, and it is an object of the present disclosure to provide a thin film transistor substrate and a display apparatus comprising the same that can form a large number of thin film transistors in a small area by placing multiple thin film transistors up and down.

In one embodiment, a thin film transistor substrate comprises a substrate; a first thin film transistor on the substrate, the first thin film transistor including a first active layer and a first gate electrode; a second thin film transistor on the substrate, the second thin film transistor including a second active layer and a second gate electrode above the first active layer and the first gate electrode; a first insulating layer between the first gate electrode and the second active layer; and; and a first connection electrode connecting together the first active layer and the second active layer, the first connection electrode extending through a first contact hole in the first insulating layer and is in contact with each of the first active layer and the second active layer.

In one embodiment, a display apparatus comprises: a substrate; a first thin film transistor on the substrate, the first thin film transistor including a first active layer and a first gate electrode; a second thin film transistor on the substrate and including a second active layer and a second gate electrode, the second active layer electrically connected to the first active layer and farther from the substrate than the first active layer and the second gate electrode farther from the substrate than the first gate electrode; one or more insulating layers between the first gate electrode and the second active layer; and one or more pixels on the substrate, the one or more pixels configured to emit light.

BRIEF DESCRIPTION OF THE DRAWINGS

The above and other objects, features and other advantages of the present disclosure will be more clearly understood from the following detailed description taken in conjunction with the accompanying drawings, in which:

FIG. 20 is a schematic cross-sectional view of a shift register according to another embodiment of the present disclosure.

FIG. 21 is a schematic cross-sectional view of a buffer unit of a shift register according to another embodiment of the present disclosure.

FIG. 22 is a schematic cross-sectional view of a shift register according to another embodiment of the present disclosure.

FIG. 23 is a schematic cross-sectional view of a display apparatus according to an embodiment of the present disclosure.

DETAILED DESCRIPTION

Figure 1:
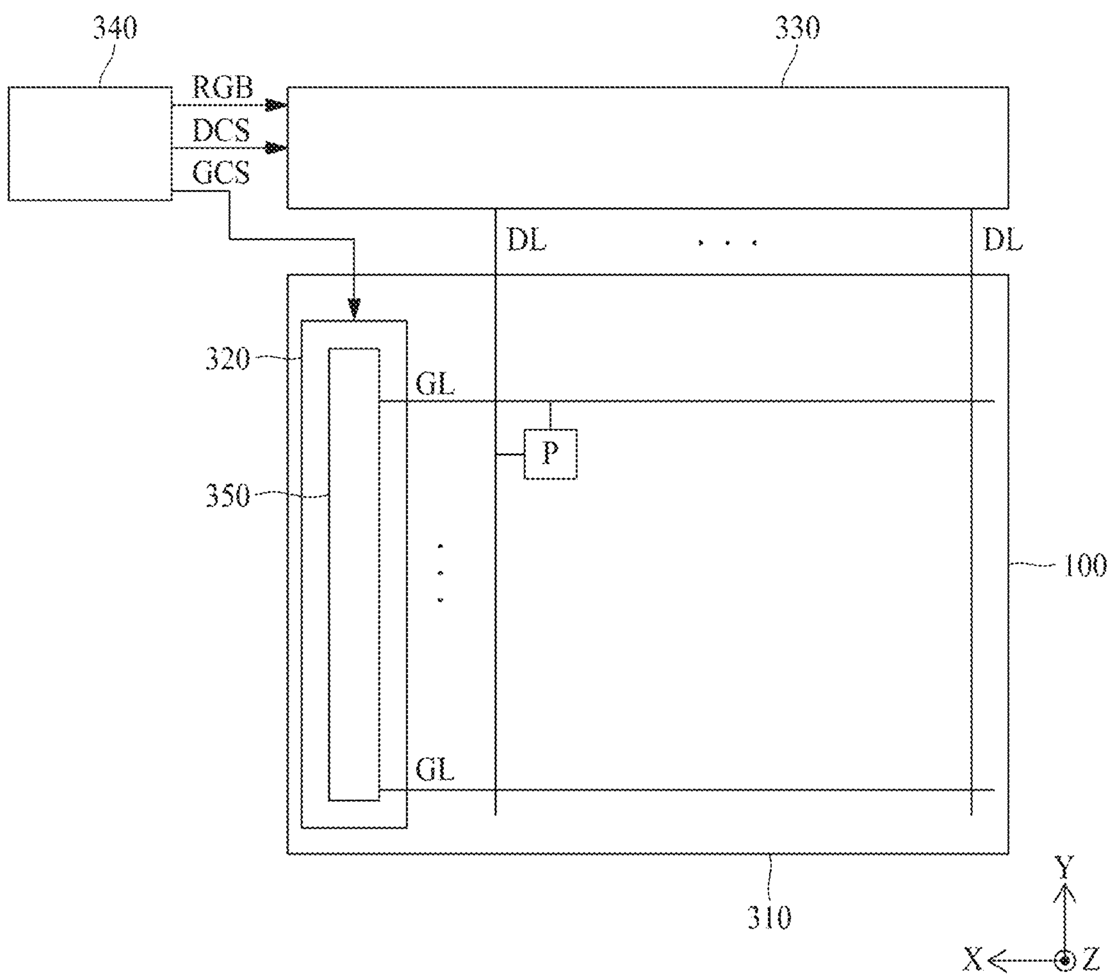
FIG. 1 is a schematic diagram of a display apparatus according to an embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used.

If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a schematic diagram of a display apparatus according to an embodiment of the present disclosure.

A display apparatus according to an embodiment of present disclosure may include a display panel 310, a gate driver 320, a data driver 330, and a controller 340, as shown in FIG. 1.

The display panel 310 includes gate lines GL and data lines DL, and pixels P are placed in the intersection of the gate lines GL and the data lines DL. An image is displayed by driving the pixel P to emit light. The gate lines GL, the data lines DL, and the pixel P may be disposed on the substrate 100.

The controller 340 controls the gate driver 320 and the data driver 330. The controller 340 outputs a gate control signal GCS for controlling the gate driver 320 and a data control signal DCS for controlling the data driver 330 using a signal supplied from an external system (not shown). In addition, the controller 340 samples input image data input from an external system and rearranges it to supply the rearranged digital image data RGB to the data driver 330.

The gate control signal GCS includes a gate start pulse, a gate shift clock, a gate output enable signal, a start signal, and a gate clock. In addition, the gate control signal GCS may include control signals for controlling the shift register.

The data control signal DCS includes a source start pulse, a source shift clock signal, a source output enable signal, and a polarity control signal.

The data driver 330 supplies a data voltage to the data lines DL of the display panel 310. Specifically, the data driver 330 converts the image data RGB input from the controller 340 into an analog data voltage and supplies the data voltage to the data lines DL.

According to an embodiment of the present disclosure, the gate driver 320 may be mounted on the display panel 310. As such, the structure in which the gate driver 320 is directly mounted on the display panel 310 is called the Gate-In-Panel (GIP) structure. Specifically, in a Gate-In-Panel (GIP) structure, the gate driver 320 may be disposed on the substrate 100.

The gate driver 320 may include a shift register 350.

The shift register 350 sequentially supplies gate-on signals to the gate lines GL during one frame using gate start pulses and gate clocks transmitted from the controller 340. In this case, one frame refers to a period in which one image is output through the display panel 310. The gate-on signal has a turn-on voltage capable of turning on a switching element disposed in the pixel P (e.g., turn on a pixel P).

In addition, the shift register 350 supplies a gate-off signal that can turn off the switching element to the gate line GL for the rest of the frame when the gate-on signal is not supplied (e.g., turn off a pixel P). The gate-on signal and the gate-off signal may be collectively referred to as a gate signal.

Figure 2:
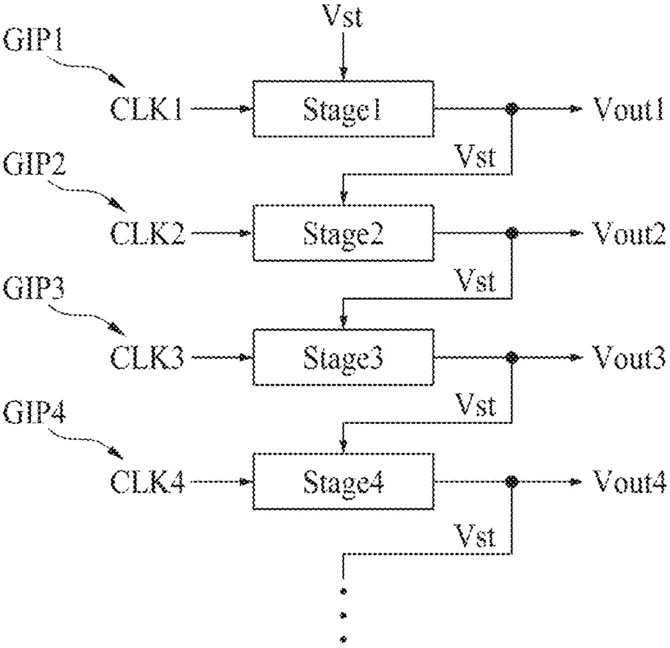
FIG. 2 is a schematic diagram of a shift register according to an embodiment of the present disclosure.

FIG. 2 is a schematic diagram of a shift register according to an embodiment of the present disclosure.

As shown in FIG. 2, each of the multiple GIP circuits GIP1 to GIP4 respectively outputs a gate signal Vout1 to Vout4 during one frame and supplies it to a gate line.

Specifically, the first stage stage 1 of the first GIP circuit GIP1 is initiated by a separate start signal Vst and outputs the first gate signal Vout1 using the first clock signal CLK1 and supplies it to the first gate line.

Each of second stage to fourth stage of the second GIP circuit GIP2 to the fourth GIP circuit GIP4 is initiated by a start signal Vst composed of gate signals Vout1 to Vout3 of the GIP circuits GIP1 to GIP3 of the previous stage and outputs the second gate signal Vout2 to the fourth gate signal Vout4 using the second clock signal CLK2 to the fourth clock signal CLK4 and supplies it to second to fourth gate line.

On the other hand, although not shown, when the last gate signal Vout is output at the stage of the last GIP circuit where one frame ends, the stage of the last GIP circuit is initialized by receiving a reset signal Vreset, Subsequently, the first gate signal Vout1 is output at the first stage stage 1 of the first GIP circuit GIP1 where the next frame begins, and the above is repeated.

Figure 3:
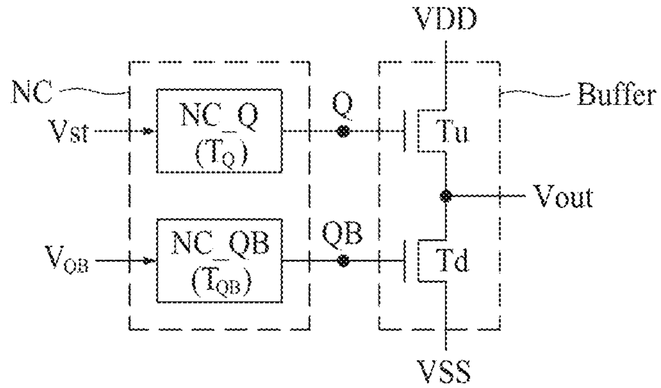
FIG. 3 is a circuit diagram of a shift register according to an embodiment of the present disclosure.

FIG. 3 is a circuit diagram of a shift register according to an embodiment of the present disclosure. Each of the plurality of GIP circuits GIP1 to GIP4 illustrated in FIG. 2 may include a circuit as illustrated in FIG. 3, but is not necessarily limited thereto.

As shown in FIG. 3, the GIP circuit includes a pull-up node Q, a pull-down node QB, a node controller NC, and a buffer unit Buffer.

The buffer unit is connected to an output terminal and includes a pull-up transistor Tu, a pull-down transistor Td, and a capacitor C.

The pull-up transistor Tu is turned on when the pull-up node Q is charged with a gate high voltage, and outputs the gate-on signal.

The pull-down transistor Td is turned on when the pull-down node QB is charged with a gate high voltage, and outputs the gate-off signal.

The capacitor C serves to maintain the gate high voltage supplied to the pull-up transistor Tu for one frame, and is provided between the gate terminal and the source terminal of the pull-up transistor Tu.

The node controller NC controls charging and discharging of the pull-up node Q and the pull-down node QB. The node controller NC may include a pull-up node controller NC_Q for controlling charging and discharging of the pull-up node Q and a pull-down node controller NC_QB for controlling charging and discharging of the pull-down node QB. The pull-up node controller NC_Q includes at least one transistor TQ for controlling the pull-up node Q, and the pull-down node controller NC_QB includes at least one transistor TQB for controlling the pull-down node QB.

The output of the gate signal Vout may be stably controlled by the node controller NC. Specifically, the node controller NC discharges the pull-down node QB with a gate low voltage when the pull-up node Q is charged with a gate high voltage, and discharges the pull-up node Q with a gate low voltage when the pull-down node QB is charged with a gate high voltage.

Therefore, when the start signal Vst is applied, the pull-up node Q is charged with a gate high voltage and the pull-down node QB is discharged with a gate low voltage by the operation of multiple transistors TQ and TQB provided in the node controller NC, and a high power voltage VDD is output as a gate signal Vout. In addition, when the discharge signal VQB is applied, the pull-up node Q is charged with a gate low voltage and the pull-down node QB is charged with a gate high voltage by the operation of multiple transistors TQ and TQB provided in the node controller NC, and a low power voltage VSS is output as a gate signal Vout.

Figure 4:
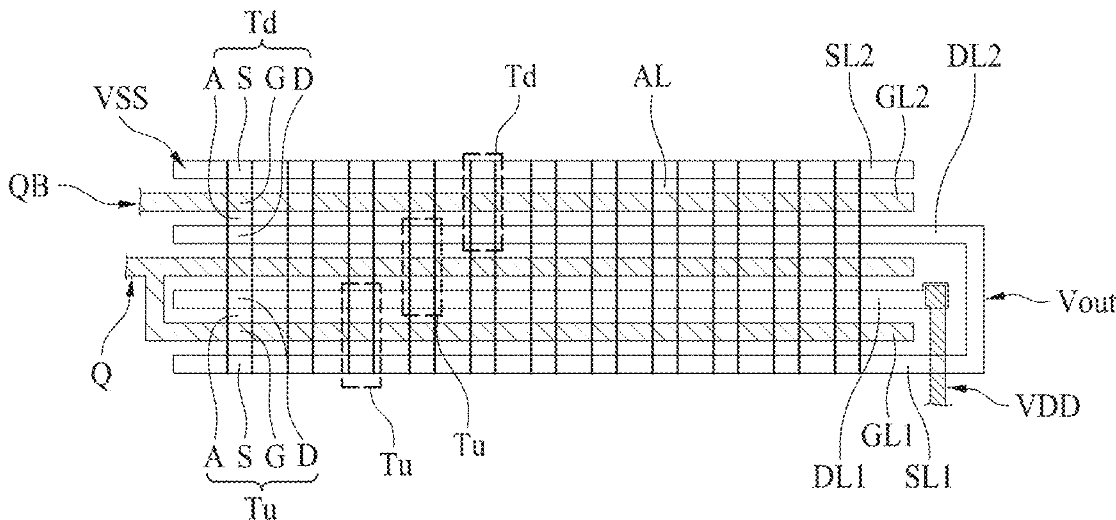
FIG. 4 is a schematic diagram of a buffer unit of a shift register according to an embodiment of the present disclosure.

FIG. 4 is a schematic diagram of a buffer unit of a shift register according to an embodiment of the present disclosure.

As shown in FIG. 4, the buffer unit of the shift register according to an embodiment of present disclosure includes a first gate line GL1, a second gate line GL2, a first drain line DL1, a second drain line DL2, a first source line SL1, and a second source line SL2.

The first gate line GL1 is connected to the pull-up node Q so that a gate voltage may be applied to a pull-up transistor Tu. For example, two first gate lines GL1 connected to the left side of the drawing may be arranged in parallel.

The second gate line GL2 is connected to the pull-down node QB so that a gate voltage may be applied to a pull-down transistor Td.

The first drain line DL1 is connected to a wiring that provides a high power voltage VDD so that a high power voltage VDD may be applied to the pull-up transistor Tu.

The first source line SL1 is electrically connected to an output terminal of the gate signal Vout so that the high power voltage VDD applied from the first drain line DL1 may be output to the gate signal Vout. In particular, two first source lines SL1 connected to the output terminal on the right side of the drawing may be arranged in parallel.

The second source line SL2 is connected to a wiring that provides a low power voltage VSS so that the low power voltage VSS can be applied to the pull-down transistor Td.

The second drain line DL2 is electrically connected to the output terminal of the gate signal Vout so that the low power voltage VSS applied from the second source line SL2 may be output to the gate signal Vout.

The first source line SL1 and the second drain line DL2 are electrically connected to each other.

In addition, the buffer unit of the shift register according to an embodiment of the present disclosure includes a plurality of active lines AL arranged in the second direction, for example, in the vertical direction. A plurality of pull-up transistors Tu and a plurality of pull-down transistors Td are configured in an area where the plurality of active lines AL arranged in the second direction and first gate line GL1, second gate line GL2, first drain line DL1, second drain line DL2, first source line SL1 and second source line SL2 arranged in the first direction intersect. For convenience, a plurality of pull-up transistors Tu and a plurality of pull-down transistors Td are indicated as rectangular dotted lines in FIG. 4.

The plurality of pull-up transistors Tu are connected in parallel to each other, and each of the plurality of pull-up transistors Tu includes a gate electrode G made up of a portion of the first gate line GL1, a source electrode S made up of a portion of the first source line SL1, a drain electrode D made up of a portion of the first drain line DL1 and an active layer A made up of a portion of the active line AL.

The plurality of pull-down transistors Td are connected in parallel to each other, and each of the plurality of pull-down transistors Td includes a gate electrode G made up of a portion of the second gate line GL2, a source electrode S made up of a portion of the second source line SL2, a drain electrode D made up of a portion of the second drain line DL2 and an active layer A made up of another portion of the active line AL.

Since the first gate line GL1 and the first source line SL1 are composed of two each, forming a U-shaped structure in which each other is interlocked (e.g., interwoven), the second gate line GL2 and the second drain line DL2 are formed one each, the number of a plurality of pull-up transistors Tu may be twice as large as the number of a plurality of pull-down transistors Td. Accordingly, reliability when outputting the high power voltage VDD as the gate signal Vout may be improved.

The plurality of pull-up transistors Tu may be disposed in a structure of two or more layers up and down, and the plurality of pull-down transistors Td may also be disposed in a structure of two or more layer up and down, thereby reducing the width of the buffer unit of the shift register. This will be described later with reference to various cross-sectional views.

Figure 5:
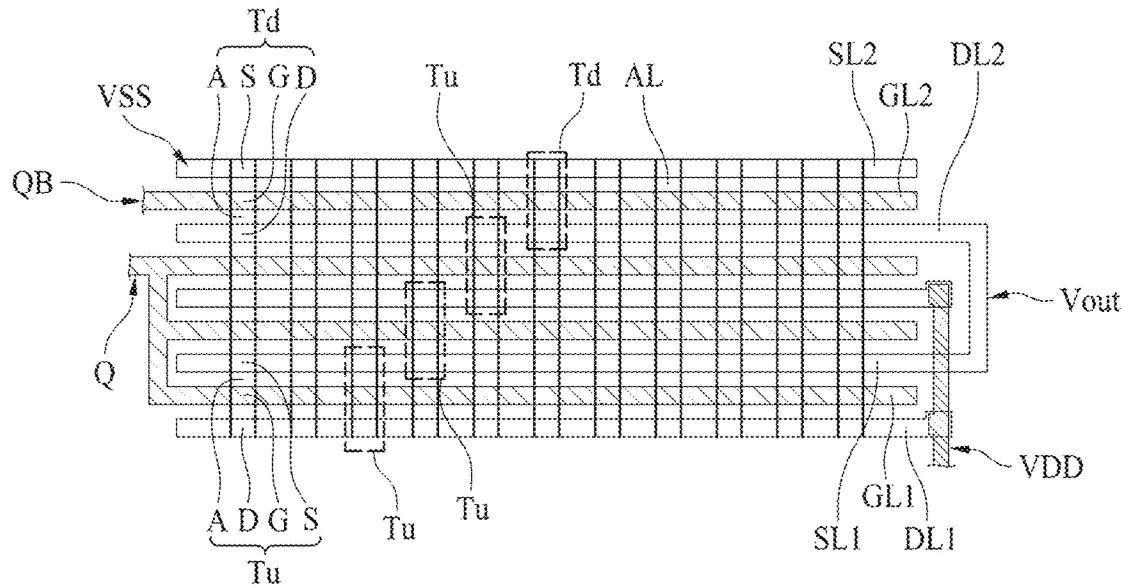
FIG. 5 is a schematic diagram of a buffer unit of a shift register according to another embodiment of the present disclosure.

FIG. 5 is a schematic diagram of a buffer unit of a shift register according to another embodiment of the present disclosure. FIG. 5 is different from FIG. 4 described above in that the number of first gate lines GL1 and first drain lines DL1 extending in the first direction is increased. Therefore, the same reference numerals are assigned to the same configuration, and hereinafter, only different configurations will be described.

According to FIG. 5, three first gate lines GL1 connected from one side, for example, the left side of the drawing, and two first drain lines DL1 connected from the right side of the drawing, for example, are arranged in parallel. Accordingly, since the first gate line GL1, the first source line SL1, and the first drain line DL1 are formed in a U-shaped structure in which each other is interlocked, the number of the plurality of pull-up transistors Tu may be three times as large as the number of the plurality of pull-down transistors Td.

In the case of FIG. 5, the plurality of pull-up transistors Tu may be disposed in a structure of two or more layers up and down, and the plurality of pull-down transistors Td may also be disposed in a structure of two or more layers up and down, thereby reducing the width of the buffer unit of the shift register.

As shown in FIGS. 4 and 5, a large number of pull-up transistors Tu and pull-down transistors Td may be provided in the buffer unit of the shift register to improve reliability, and accordingly, the size of the buffer unit may be increased. However, according to an embodiment of present disclosure, it provides a method of placing the plurality of pull-up transistors Tu and the plurality of pull-down transistors Td up and down (e.g., vertically) to reduce the size of the buffer unit, which will be described in detail below.

Figure 6:
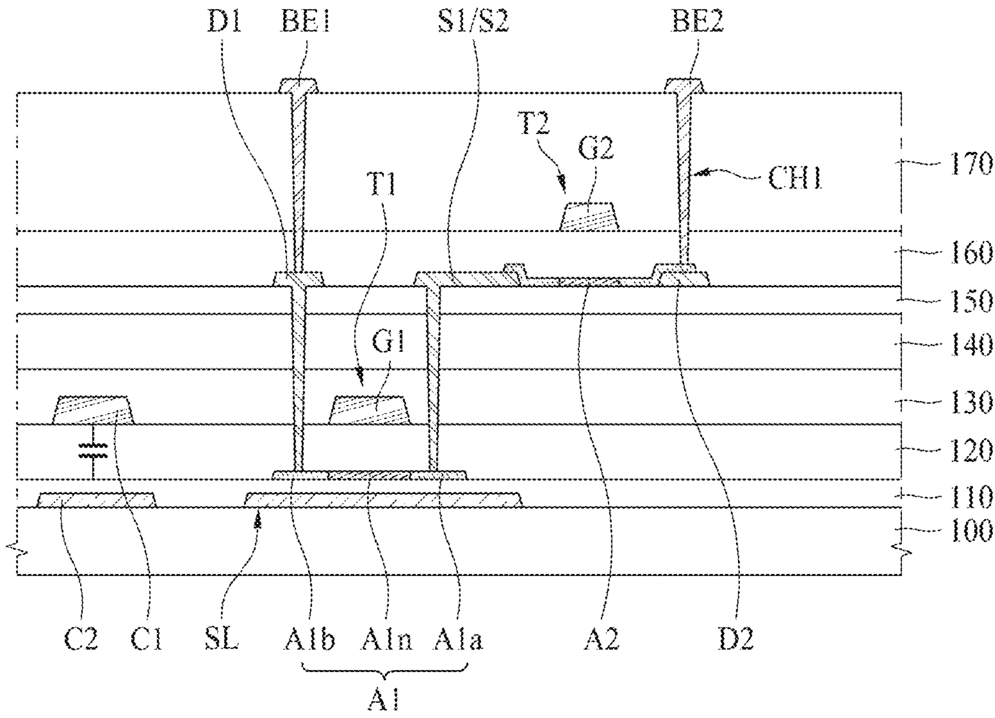
FIG. 6 is a cross-sectional view of a buffer unit of a shift register according to an embodiment of the present disclosure.

FIG. 6 is a cross-sectional view of a buffer unit of a shift register according to an embodiment of the present disclosure.

As shown in FIG. 6, the buffer unit according to an embodiment of present disclosure includes a substrate 100, first to seventh insulating layers 110, 120, 130, 140, 150, 160, 170, a first thin film transistor T1 including a first active layer A1, a first gate electrode G1, a first source electrode S1 and a first drain electrode D1, a second thin film transistor T2 including a second active layer A2, a second gate electrode G2, a second source electrode S2 and a second drain electrode D2, a capacitor including a first capacitor electrode C1 and a second capacitor electrode C2, a first bridge electrode BE1, and a second bridge electrode BE2.

The first thin film transistor T1 and the second thin film transistor T2 may be connected in parallel with each other to form a pull-up transistor Tu. In this case, the first gate electrode G1 and the second gate electrode G2 may be electrically connected to the pull-up node Q, the first source electrode S1 and the second source electrode S2 may be electrically connected to the output terminal of the gate signal Vout, and the first drain electrode D1 and the second drain electrode D2 may be electrically connected to a wiring providing a high power voltage VDD.

Alternatively, the first thin film transistor T1 and the second thin film transistor T2 may be connected in parallel with each other to form a pull-down transistor Td. In this case, the first gate electrode G1 and the second gate electrode G2 may be electrically connected to the full-down node QB, the first drain electrode D1 and the second drain electrode D2 may be electrically connected to the output terminal of the gate signal Vout, and the first source electrode S1 and the second source electrode S2 may be electrically connected to a wiring providing a low power voltage VSS.

The first source electrode S1 and the first drain electrode D1 are distinguished for convenience of explanation, and the first source electrode S1 and the first drain electrode D1 may be changed from each other. For example, the first source electrode S1 may be a first drain electrode D1, and the first drain electrode D1 may be a first source electrode S1. The same is true between the second source electrode S2 and the second drain electrode D2.

The substrate 100 may be made of glass or plastic. In particular, the substrate 100 may be made of transparent plastic having flexible characteristics, for example, polyimide. When polyimide is used as the substrate 100, heat-resistant polyimide that can withstand high temperatures may be used considering that a high-temperature deposition process is performed on the substrate 100.

A light blocking layer SL and the second capacitor electrode C2 are provided on the substrate 100.

The light blocking layer SL overlaps the first active layer A1 of the first thin film transistor T1 to prevent or at least reduce external light from entering the first active layer A1. The light blocking layer SL may be omitted in other embodiments.

Although not illustrated, the second capacitor electrode C2 may be electrically connected to the light blocking layer SL and may be integrally formed with the light blocking layer SL.

The second capacitor electrode C2 and the light blocking layer SL can be formed of the same material such as a metal or a metal conductive material in the same layer through the same process.

A first insulating layer 110 is provided on the light blocking layer SL and the second capacitor electrode C2. The first insulating layer 110 may protect the first active layer A1 by blocking air and moisture. The first insulating layer 110 may be made of an inorganic insulating material such as silicon oxide, silicon nitride, or metal oxide, but is not limited thereto and may be made of an organic insulating material. The first insulating layer 110 may be formed of a single layer or may be formed of a plurality of layers.

The first active layer A1 is provided on the first insulating layer 110.

The first active layer A1 may include a channel part A1*n*, a first connection part A1*a*, and a second connection part A1*b*. The first connection part A1*a* may be connected to one side (e.g., a first side) of the channel part A1*n*, and the second connection part A1*b* may be connected to another side (e.g., a second side) of the channel part A1*n* that is opposite the one side. The channel part A1*n* is made of a semiconductor material and may overlap the first gate electrode G1 to be protected by the first gate electrode G1. The first connection part A1*a* and the second connection part A1*b* may have conductive properties by selectively conducting a semiconductor material. The first connection part A1*a* and the second connection part A1*b* may not overlap the first gate electrode G1. The first connection part A1*a* and the second connection part A1*b* have greater conductivity compared to the channel part A1*n*, and each may serve as a wiring or source/drain electrode.

Although the second active layer A2 described below is not illustrated in detail, it may include a channel part, a first connection part, and a second connection part in the same manner as the first active layer A1.

A second insulating layer 120 is provided on the first active layer A1. The second insulating layer 120 insulates the first active layer A1 from the first gate electrode G1. The second insulating layer 120 may be formed of a single layer or a plurality of layers including an inorganic insulating material and/or an organic insulating material.

The first gate electrode G1 of the first thin film transistor T1 and the first capacitor electrode C1 are provided on the second insulating layer 120.

The first gate electrode G1 is formed to overlap the first active layer A1, and the first capacitor electrode C1 is formed to overlap the second capacitor electrode C2. The first gate electrode G1 is connected to the first capacitor electrode C1, and the first gate electrode G1 and the first capacitor electrode C1 may be integrally formed.

The first gate electrode G1 and the first capacitor electrode C1 may be formed of the same material in the same layer through the same process.

A third insulating layer 130 is provided on the first gate electrode G1 and the first capacitor electrode C1. The third insulating layer 130 may be formed of a single layer or a plurality of layers including an inorganic insulating material and/or an organic insulating material.

A fourth insulating layer 140 is formed on the third insulating layer 130. The fourth insulating layer 140 may function as a planarization layer. The fourth insulating layer 140 may include a single layer or a plurality of layers including an organic insulating material, but is not limited thereto.

A fifth insulating layer 150 is formed on the fourth insulating layer 140. The fifth insulating layer 150 may be formed of a single layer or a plurality of layers including an inorganic insulating material and/or an organic insulating material.

The first source electrode S1 and the first drain electrode D1 of the first thin film transistor T1, and the second source electrode S2 and the second drain electrode D2 of the second thin film transistor T2 are provided on the fifth insulating layer 150.

The first source electrode S1 of the first thin film transistor T1 may be electrically connected to the first active layer A1, particularly, the first connection part A1*a*, and may also be electrically connected to the light blocking layer SL. Specifically, the first source electrode S1 is electrically connected to the first connection part A1*a* of the first active layer A1 through a contact hole provided in the second to fifth insulating layers 120, 130, 140, and 150, and is electrically connected to the light blocking layer SL through a contact hole provided in the first to fifth insulating layers 110, 120, 130, 140, and 150. Accordingly, the first source electrode S1 functions as a connection electrode electrically connecting the first active layer A1 with the light blocking layer SL. In addition, the first source electrode S1 functions as a connection electrode connecting the first active layer A1 with the second active layer A2.

The first drain electrode D1 of the first thin film transistor T1 is electrically connected to the first active layer A1, particularly, the second connection part A1*b*. Specifically, the first drain electrode D1 is electrically connected to the second connection part A1*b* of the first active layer A1 through a contact hole provided in the second to fifth insulating layers 120, 130, 140, and 150. The first drain electrode D1 may function as a connection electrode connecting the first active layer A1 with the first bridge electrode BE1.

The second source electrode S2 of the second thin film transistor T2 may be integrally formed with the first source electrode S1. The second source electrode S2 may connect the second active layer A2 to the light blocking layer SL. In addition, the second source electrode S2 may connect the second active layer A2 with the first active layer A1.

The second source electrode S2 of the second thin film transistor T2 is connected to one side (e.g., a first side) of the second active layer A2, and the second drain electrode D2 of the second thin film transistor T2 is connected to another side (e.g., a second side) of the second active layer A2 that is opposite the one side. Although not specifically illustrated, the second drain electrode D2 of the second thin film transistor T2 is electrically connected to the first drain electrode D1 of the first thin film transistor T1. For example, one of the first drain electrode D1 and the second drain electrode D2 may extend to the other and be connected to each other to be formed integrally with each other, or the first drain electrode D1 and the second drain electrode D2 may be electrically connected to each other by connecting the first bridge electrode BE1 and the second bridge electrode BE2 to be described later.

The second active layer A2 is provided on the second source electrode S2 and the second drain electrode D2.

A portion of the lower surface of the second active layer A2 is in direct contact with an upper and side surfaces of the second source electrode S2 and is also in direct contact with an upper and side surfaces of the second drain electrode D2. Specifically, one end of the lower surface of the second active layer A2 is in direct contact with a portion of the upper surface and one side of the second source electrode S2, and another end of the lower surface of the second active layer A2 is in contact with a portion of the upper surface and one side of the second drain electrode D2.

Therefore, according to an embodiment of present disclosure, Since the lower end surface of the first source electrode S1 or the second source electrode S2 is in contact with the upper surface of the first active layer A1, and the side and top surface of the first source electrode S1 or the second source electrode S2 are in contact with the lower surface of the second active layer A2, the second thin film transistor T2 and the first thin film transistor T1 may be electrically connected to each other by the first source electrode S1 or the second source electrode S2 extending into the contact hole provided in the second to fifth insulating layers 120, 130, 140, and 150, thereby reducing the number of contact holes and masks for forming patterns.

A sixth insulating layer 160 is formed on the second active layer A2. The sixth insulating layer 160 may be formed of a single layer or a plurality of layers including an inorganic insulating material and/or an organic insulating material.

A second gate electrode G2 of the second thin film transistor T2 is provided on the sixth insulating layer 160.

A seventh insulating layer 170 is provided on the second gate electrode G2. The seventh insulating layer 170 may be formed of a single layer or a plurality of layers including an inorganic insulating material and/or an organic insulating material.

A first bridge electrode BE1 and a second bridge electrode BE2 are provided on the seventh insulating layer 170.

The first bridge electrode BE1 may be electrically connected to the first drain electrode D1 through a contact hole provided in the sixth to seventh insulating layers 160, 170, and the second bridge electrode BE2 may be electrically connected to the second drain electrode D2 provided through a first contact hole CH1 provided in the sixth to seventh insulating layers 160, 170.

When the first thin film transistor T1 and the second thin film transistor T2 are formed of a pull-up transistor Tu connected in parallel to each other, the first bridge electrode BE1 may connect the first drain electrode D1 with a wiring providing a high power voltage VDD, and the first bridge electrode BE1 may be formed as a portion of a wiring providing the high power voltage VDD. In this case, the second bridge electrode BE2 is electrically connected to the first bridge electrode BE1, and the second bridge electrode BE2 may connect the second drain electrode D2 with a wiring providing the high power voltage VDD, or may be formed as a portion of a wiring providing the high power voltage VDD.

When the first thin film transistor T1 and the second thin film transistor T2 are formed of a pull-down transistor Td connected in parallel to each other, the first bridge electrode BE1 may connect the first drain electrode D1 with the output terminal of the gate signal Vout and the first bridge electrode BE1 may be formed as a portion of an output terminal of the gate signal Vout. In this case, the second bridge electrode BE2 is electrically connected to the first bridge electrode BE1, and the second bridge electrode BE2 may connect the second drain electrode D2 with the output terminal of the gate signal Vout, or may be formed as a portion of the output terminal of the gate signal Vout.

The first bridge electrode BE1 and the second bridge electrode BE2 may be formed of the same material on the same layer through the same process. At least one of the first bridge electrode BE1 and the second bridge electrode BE2 may be omitted.

Since the first thin film transistor T1 is placed at a lower part closer to the substrate 100 than the second thin film transistor T2, and the second thin film transistor T2 is placed at a far upper part of the substrate 100 that is farther from the substrate than the first thin film transistor T1, it is possible to more easily place a number of thin film transistors in the buffer unit, thereby reducing the size of the buffer unit and thus reducing the bezel size of the display apparatus.

In particular, when the second thin film transistor T2 includes a second active layer A2 with high mobility characteristics, the second active layer A2 is directly connected to the second source electrode S2 and the second drain electrode D2 already provided below it, so that the heat-treatment process at the time of forming the second source electrode S2 and the second drain electrode D2 is not affected to the second active layer A2, so that high mobility characteristics of the second active layer A2 may be prevented or reduced from deteriorating.

Figure 7:
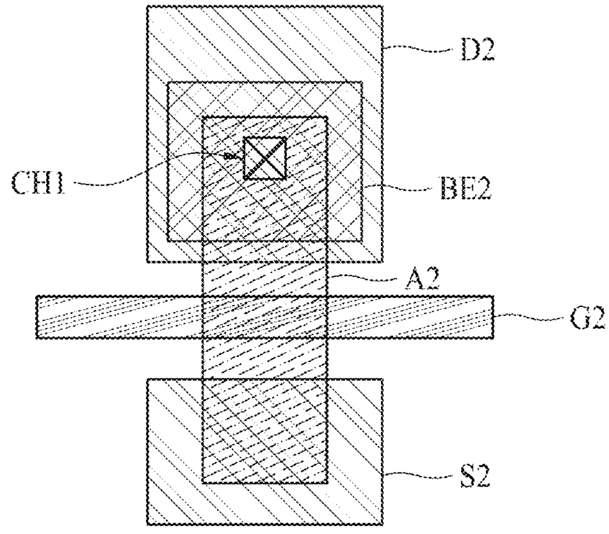
FIG. 7 is a schematic plan view of a buffer unit of a shift register according to an embodiment of the present disclosure.

FIG. 7 is a schematic plan view of a buffer unit of a shift register according to an embodiment of the present disclosure, which is a plan view of an area of a second thin film transistor T2 in FIG. 6.

As shown in FIG. 7, the second gate electrode G2 extends in the horizontal direction, the second drain electrode D2 is provided on one side of the second gate electrode G2 such as on the upper side of the second gate electrode G2, and the second source electrode S2 is on another side of the second gate electrode G2 such as the lower side of the second gate electrode G2, and the second active layer A2 extends in the vertical direction and is provided to overlap the second gate electrode G2, the second source electrode S2, and the second drain electrode D2.

In this case, the second bridge electrode BE2 is formed to overlap the second drain electrode D2 and the second active layer A2. The first contact hole CH1 is formed to overlap the second bridge electrode BE2, the second drain electrode D2, and the second active layer A2. The second bridge electrode BE2 and the second active layer A2 are connected through the first contact hole CH1.

Figure 8:
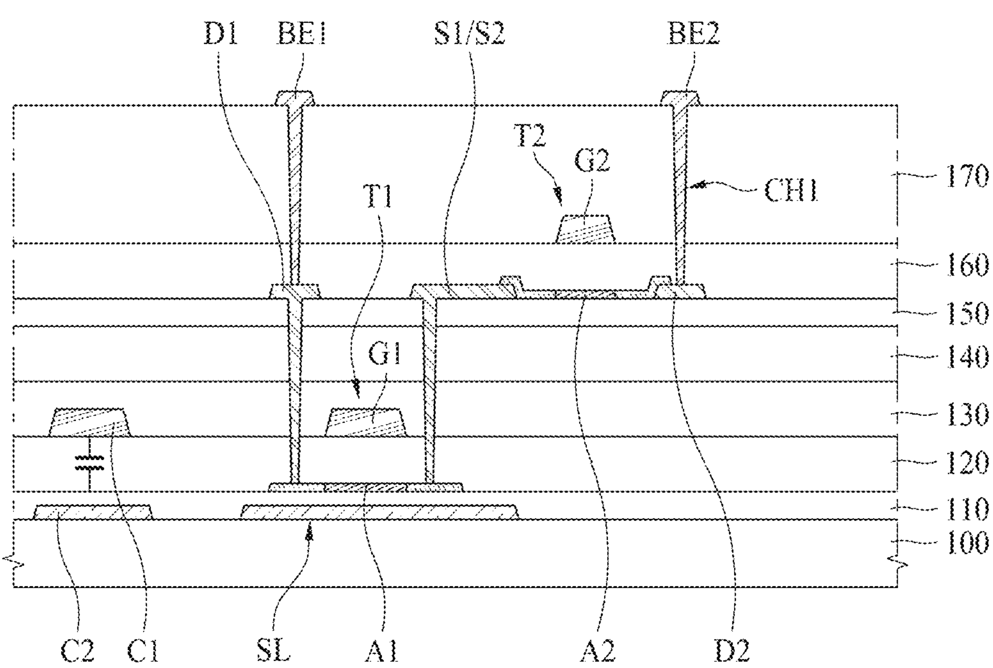
FIG. 8 is a cross-sectional view of a buffer unit of a shift register according to another embodiment of the present disclosure.

FIG. 8 is a cross-sectional view of a buffer unit of a shift register according to another embodiment of the present disclosure.

FIG. 8 is the same as FIG. 6 except that the connection structure of the second bridge electrode BE2 is changed, and thus the same reference numerals are applied to the same configuration, and different configurations will be described below.

As shown in FIG. 8, the second bridge electrode BE2 is connected to the second drain electrode D2 through a first contact hole CH1 provided in the sixth to seventh insulating layers 160, 170.

That is, in FIG. 6, the second bridge electrode BE2 is in contact with the second active layer A2, while in FIG. 8, the second bridge electrode BE2 is in contact with the second drain electrode D2.

Figure 9:
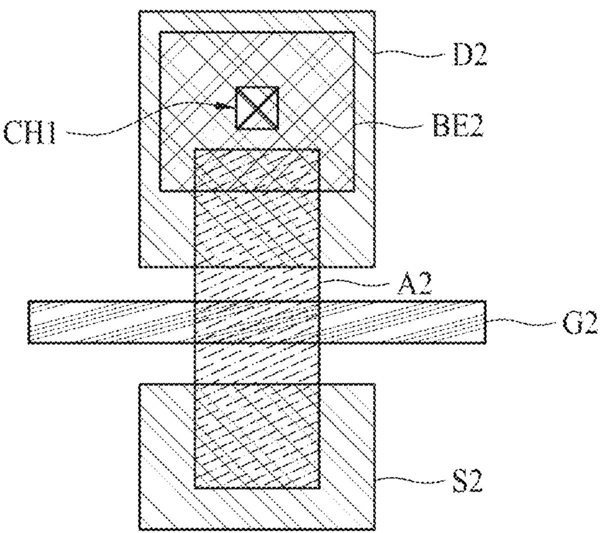
FIG. 9 is a schematic plan view of a buffer unit of a shift register according to another embodiment of the present disclosure.

FIG. 9 is a schematic plan view of a buffer unit of a shift register according to another embodiment of the present disclosure, which is a plan view of an area of a second thin film transistor T2 in FIG. 8.

FIG. 9 is the same as FIG. 7 except that the position of the second bridge electrode BE2 is changed, and thus the same reference numerals are applied to the same configuration, and different configurations will be described below.

As shown in FIG. 9, the second bridge electrode BE2 is formed to overlap the second drain electrode D2 and the second active layer A2. In some cases, the second bridge electrode BE2 may overlap the second drain electrode D2 but may not overlap the second active layer A2.

The first contact hole CH1 overlaps the second bridge electrode BE2 and the second drain electrode D2, but does not overlap (e.g., non-overlapping) the second active layer A2. Accordingly, the second bridge electrode BE2 and the second drain electrode D2 are connected through the first contact hole CH1.

Figure 10:
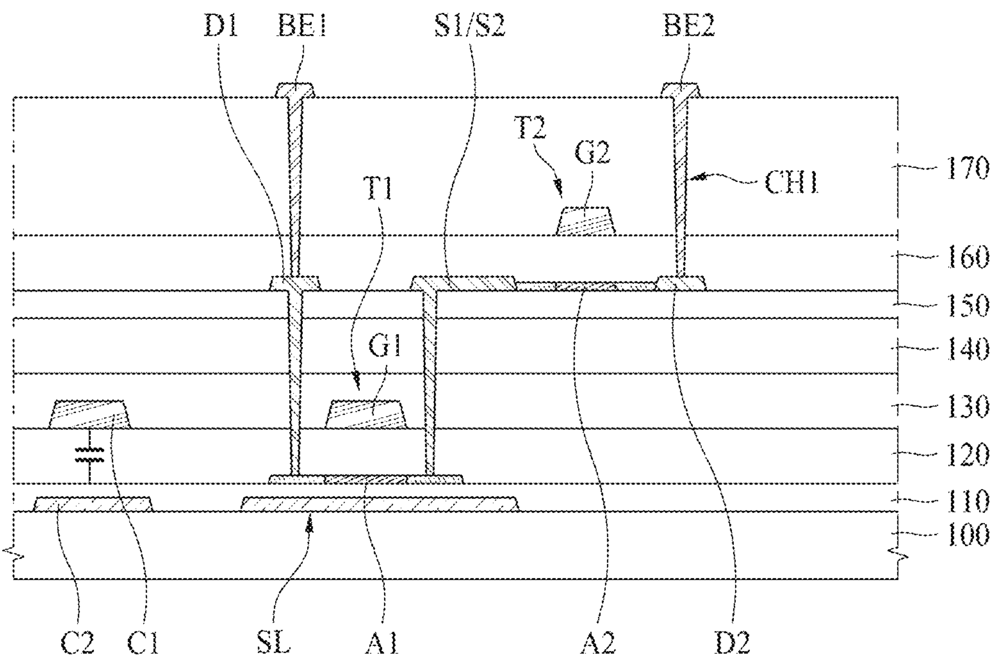
FIG. 10 is a schematic cross-sectional view of a buffer unit of a shift register according to another embodiment of the present disclosure.

FIG. 10 is a schematic cross-sectional view of a buffer unit of a shift register according to another embodiment of the present disclosure.

FIG. 10 is the same as FIG. 6 except that the connection structure of the second bridge electrode BE2 and the structure of the second active layer A2 are changed, and thus the same reference numerals are assigned to the same configuration, and only different configurations will be described below.

As shown in FIG. 10, the second bridge electrode BE2 is connected to the second drain electrode D2 through a first contact hole CH1 provided in the sixth to seventh insulating layers 160, 170. That is, in FIG. 6, the second bridge electrode BE2 is in contact with the second active layer A2, while in FIG. 10, the second bridge electrode BE2 is in contact with the second drain electrode D2.

In addition, the second active layer A2 is in contact with one side of the second source electrode S2 and one side of the second drain electrode D2, and is not in contact with an upper surface of the second source electrode S2 and an upper surface of the second drain electrode D2.

Figure 11:
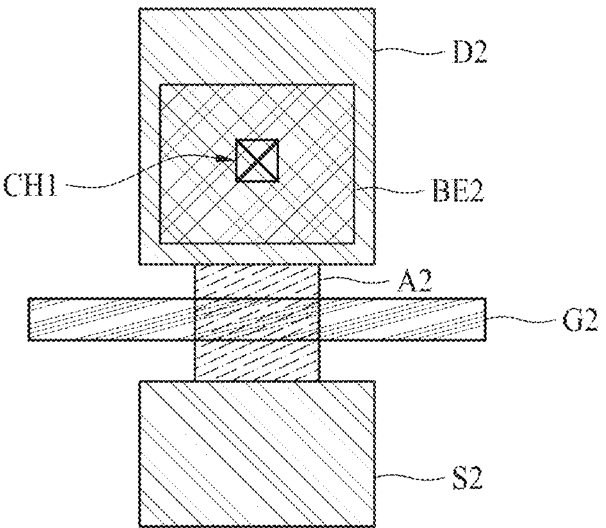
FIG. 11 is a schematic plan view of a buffer unit of a shift register according to another embodiment of the present disclosure.

FIG. 11 is a schematic plan view of a buffer unit of a shift register according to another embodiment of the present disclosure, which is a plan view of a area of a second thin film transistor T2 in FIG. 10.

Hereinafter, only configurations different from those of FIG. 7 will be described.

As shown in FIG. 11, the second active layer A2 is in contact with one end of the second source electrode S2 and one end of the second drain electrode D2, respectively, and does not overlap the second source electrode S2 and the second drain electrode D2.

The second bridge electrode BE2 overlaps the second drain electrode D2 but does not overlap the second active layer A2.

The first contact hole CH1 overlaps the second bridge electrode BE2 and the second drain electrode D2, but does not overlap (e.g., non-overlapping) the second active layer A2. Accordingly, the second bridge electrode BE2 and the second drain electrode D2 are connected through the first contact hole CH1.

Figure 12:
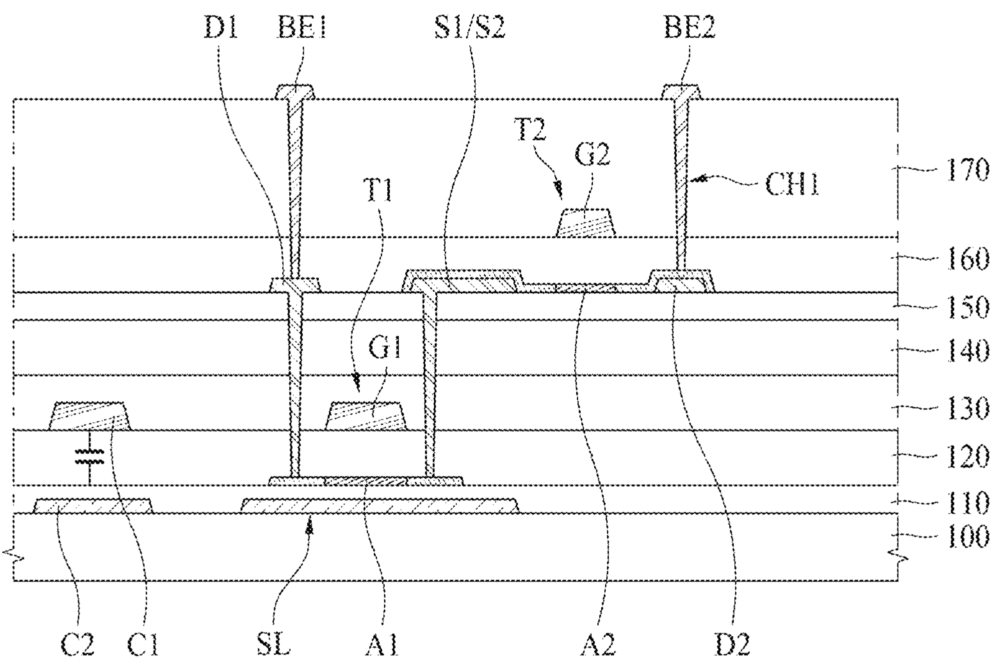
FIG. 12 is a schematic cross-sectional view of a buffer unit of a shift register according to another embodiment of the present disclosure.

FIG. 12 is a schematic cross-sectional view of a buffer unit of a shift register according to another embodiment of the present disclosure.

FIG. 12 is the same as FIG. 6 except that the structure of the second active layer A2 is changed, and thus the same reference numerals are applied to the same configuration, and different configurations will be described below.

As shown in FIG. 12, a first portion of the second active layer A2 is in contact with one side surface (e.g., a first side surface), another side surface (e.g., a second side surface) that is opposite the one side surface of the second source electrode S2, and an entire upper surface of the second source electrode S2 that is between the one side surface and the other side surface of the second source electrode S2, and a second portion of the second active layer A2 is in contact with one side surface of the second drain electrode D2, another side surface (e.g., a second side surface) of the second drain electrode D2 that is opposite the one side surface of the second drain electrode D2, and an entire upper surface of the second drain electrode D2 that is between the one side surface and the other side surface of the second drain electrode D2.

Figure 13:
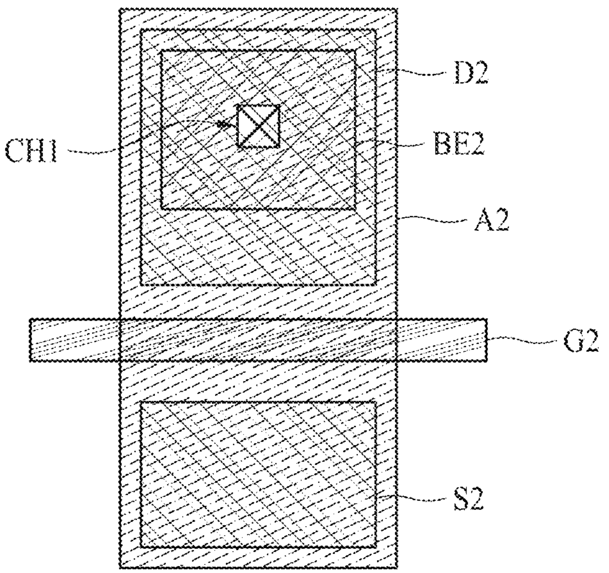
FIG. 13 is a schematic plan view of a buffer unit of a shift register according to another embodiment of the present disclosure.

FIG. 13 is a schematic plan view of a buffer unit of a shift register according to another embodiment of the present disclosure, which is a plan view of a second thin film transistor T2 area in FIG. 12. Hereinafter, only configurations different from those of FIG. 7 will be described.

As shown in FIG. 13, the second active layer A2 is formed to overlap the entire second source electrode S2 and the second drain electrode D2.

The second bridge electrode BE2 is formed to overlap the second drain electrode D2 and the second active layer A2.

The first contact hole CH1 is formed to overlap the second bridge electrode BE2, the second drain electrode D2, and the second active layer A2. The second bridge electrode BE2 and the second active layer A2 are connected through the first contact hole CH1.

Figure 14:
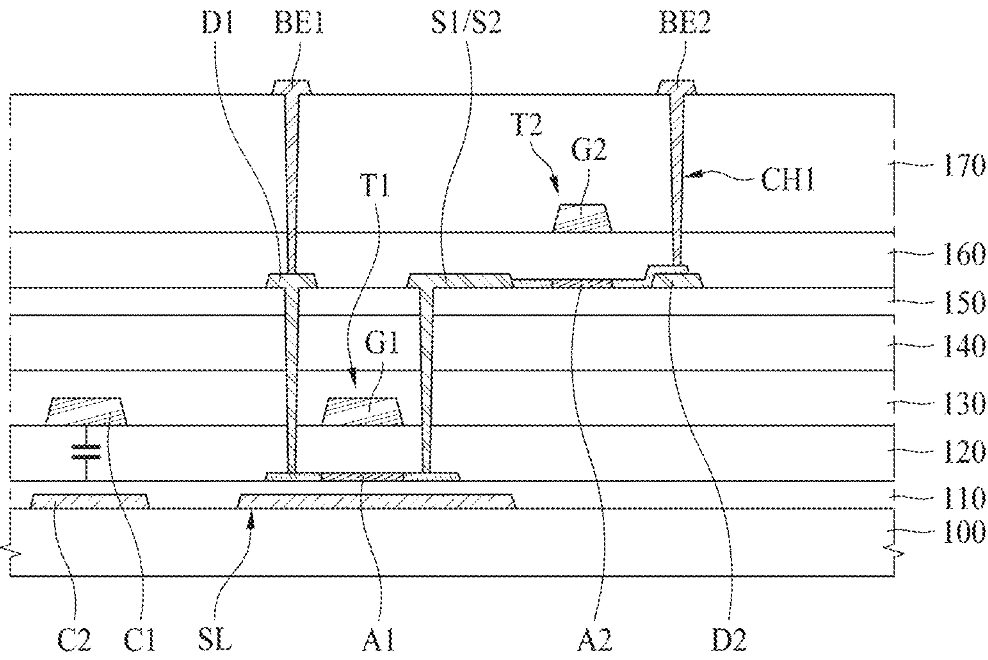
FIG. 14 is a schematic cross-sectional view of a buffer unit of a shift register according to another embodiment of the present disclosure.

FIG. 14 is a schematic cross-sectional view of a buffer unit of a shift register according to another embodiment of the present disclosure.

FIG. 14 is the same as FIG. 6 except that the structure of the second active layer A2 is changed, and thus the same reference numerals are applied to the same configuration, and different configurations will be described below.

As shown in FIG. 14, a first portion of the second active layer A2 is in contact with one side surface of the second source electrode S2 and is not in contact with the upper surface of the second source electrode S2. However, a second portion of the second active layer A2 is in contact with one side surface and a portion of the upper surface of the second drain electrode D2.

Figure 15:
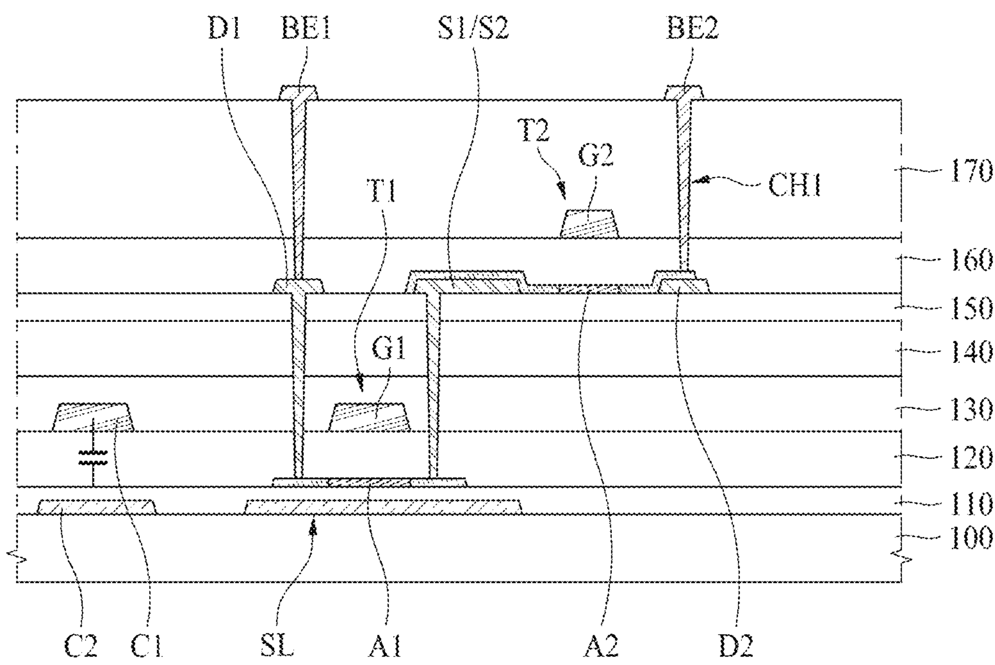
FIG. 15 is a schematic cross-sectional view of a buffer unit of a shift register according to another embodiment of the present disclosure.

FIG. 15 is a schematic cross-sectional view of a buffer unit of a shift register according to another embodiment of the present disclosure.

FIG. 15 is the same as FIG. 6 except that the structure of the second active layer A2 is changed, and thus the same reference numerals are applied to the same configuration, and different configurations will be described below.

As shown in FIG. 15, a first portion of the second active layer A2 contacts one side surface (e.g., a first side surface), another side surface (e.g., a second side surface) that is opposite the one side surface of the second source electrode S2, and an entire upper surface of the second source electrode S2 that is between the one side surface and the other side surface of the second source electrode S2. However, the second active layer A2 is in contact with one side surface and a portion of the upper surface of the second drain electrode D2 that is less than the entire upper surface of the second drain electrode D2.

As shown in FIGS. 14 and 15, an overlapping structure between one side of the second active layer A2 and the second source electrode S2 may be different from an overlapping structure between the other side of the second active layer A2 and the second drain electrode D2.

Figure 16:
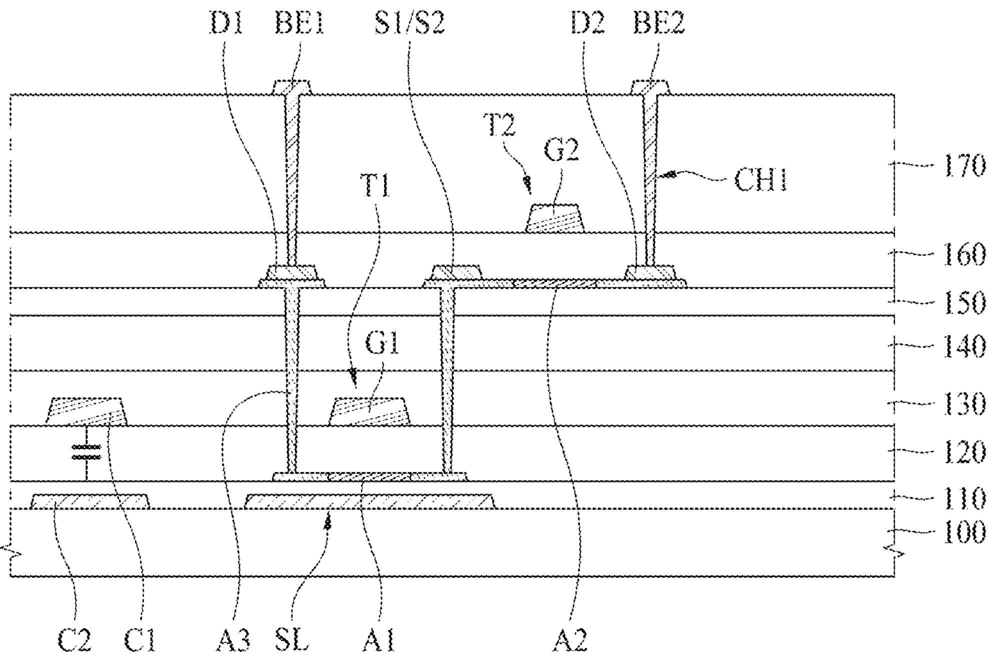
FIG. 16 is a schematic cross-sectional view of a buffer unit of a shift register according to another embodiment of the present disclosure.

FIG. 16 is a schematic cross-sectional view of a buffer unit of a shift register according to another embodiment of the present disclosure.

FIG. 16 differs from FIG. 6 in that a second active layer A2 directly contacts a first active layer A1, and a third active layer A3 directly contacts the first active layer A1. Hereinafter, only different configurations will be described.

As shown in FIG. 16, the second active layer A2 is directly connected to the first active layer A1 through a contact hole provided in the second to fifth insulating layers 120, 130, 140, and 150. In particular, the connection part of the second active layer A2 is connected to the connection part of the first active layer A1, and the connection part of the second active layer A2 extends into the contact hole provided in the second to fifth insulating layers 120, 130, 140, and 150. Therefore, the connection part of the second active layer A2 extending into the contact hole functions as a connection electrode connecting the first active layer A1 and the second active layer A2.

A second source electrode S2 is provided on a first portion of the upper surface of the second active layer A2, and a second drain electrode D2 is provided on a second portion of the upper surface of the second active layer A2. An entire lower surface of the second source electrode S2 may be in contact with the first portion of the upper surface of the second active layer A2, and an entire lower surface of the second drain electrode D2 may be in contact with the second portion of the upper surface of the second active layer A2.

In addition, the second bridge electrode BE2 is in contact with the second drain electrode D2 through a contact hole provided in the sixth to seventh insulating layers 160, 170. In some cases, the second bridge electrode BE2 may be in contact with the second active layer A2 through a contact hole provided in the sixth to seventh insulating layers 160, 170.

A third active layer A3 is connected to the first active layer A1 through a contact hole provided in the second to fifth insulating layers 120, 130, 140, 150. In this case, the third active layer A3 may be formed on the same layer as the second active layer A2 through the same process. The third active layer A3 may be formed of the same material as the connection part of the second active layer A2 having excellent conductivity.

A first drain electrode D1 is provided on an upper surface of the third active layer A3. An entire lower surface of the first drain electrode D1 may be in contact with the upper surface of the third active layer A3.

In addition, the first bridge electrode BE1 is in contact with the first drain electrode D1 through a contact hole provided in the sixth to seventh insulating layers 160, 170. In some cases, the first bridge electrode BE1 may contact the third active layer A3 through a contact hole provided in the sixth to seventh insulating layers 160 and 170.

According to another embodiment of present disclosure, since the second active layer A2 is in direct contact with the first active layer A1, the second thin film transistor T2 and the first thin film transistor T1 may be electrically connected with each other by one second active layer A2 extending into the contact hole provided in the second to fifth insulating layers 120, 130, 140, and 150, thereby reducing the number of contact holes and masks for forming patterns.

Figure 17:
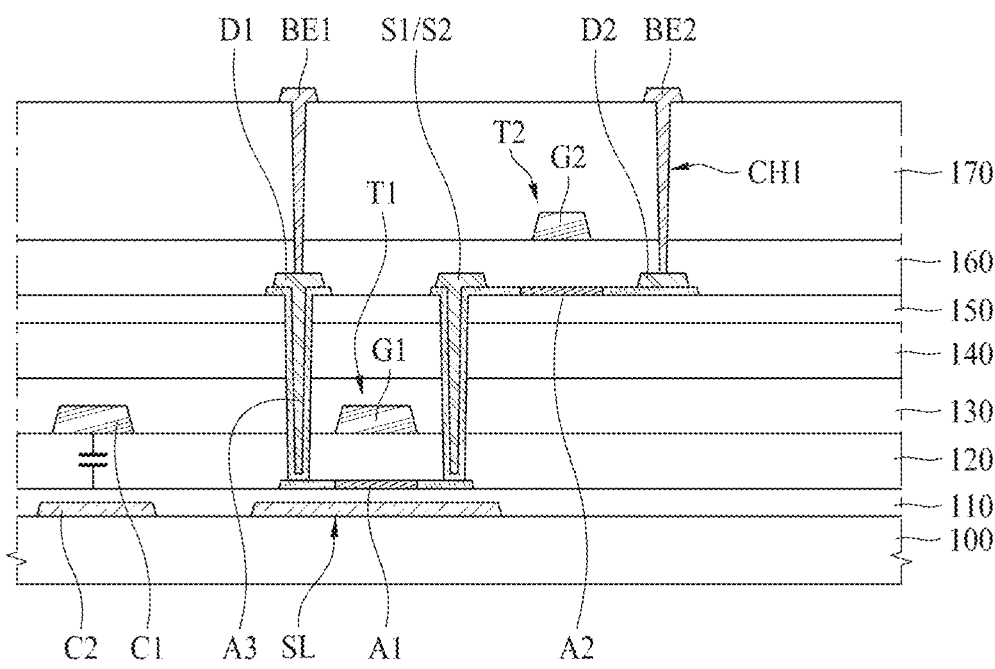
FIG. 17 is a schematic cross-sectional view of a buffer unit of a shift register according to another embodiment of the present disclosure.

FIG. 17 is a schematic cross-sectional view of a buffer unit of a shift register according to another embodiment of the present disclosure.

FIG. 17 is different from FIG. 16 described above in that the second active layer A2 and the second source electrode S2 extend inside a first contact hole, and the third active layer A3 and the first drain electrode D1 extend inside a second contact hole.

Figure 18:
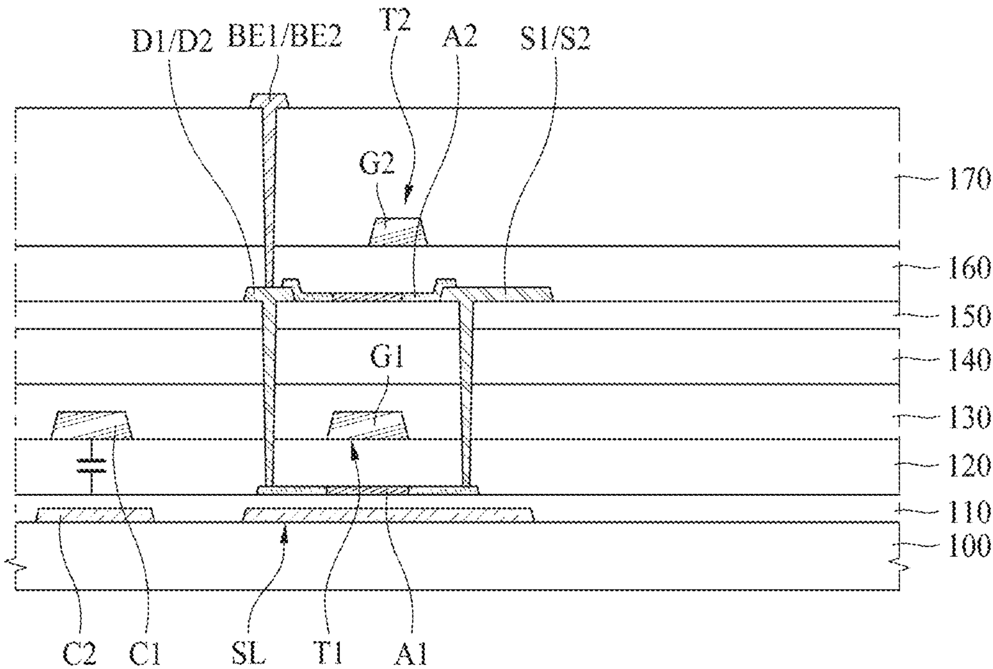
FIG. 18 is a schematic cross-sectional view of a buffer unit of a shift register according to another embodiment of the present disclosure.

FIG. 18 is a schematic cross-sectional view of a buffer unit of a shift register according to another embodiment of the present disclosure.

FIG. 18 is different from FIG. 6 in that the first active layer A1 and the second active layer A2 overlap each other, and the first gate electrode G1 and the second gate electrode G2 overlap each other.

As shown in FIG. 18, since the first active layer A1, the second active layer A2, the first gate electrode G1, and the second gate electrode G2 are formed to overlap each other, the entire area of the first thin film transistor T1 may be formed to overlap the entire area of the second thin film transistor T2, and thus the size of the buffer unit may be further reduced.

In addition, in FIG. 18, the first drain electrode D1 and the second drain electrode D2 are formed integrally with each other, and accordingly, the first bridge electrode BE1 and the second bridge electrode BE2 are formed integrally with each other.

Figure 19:
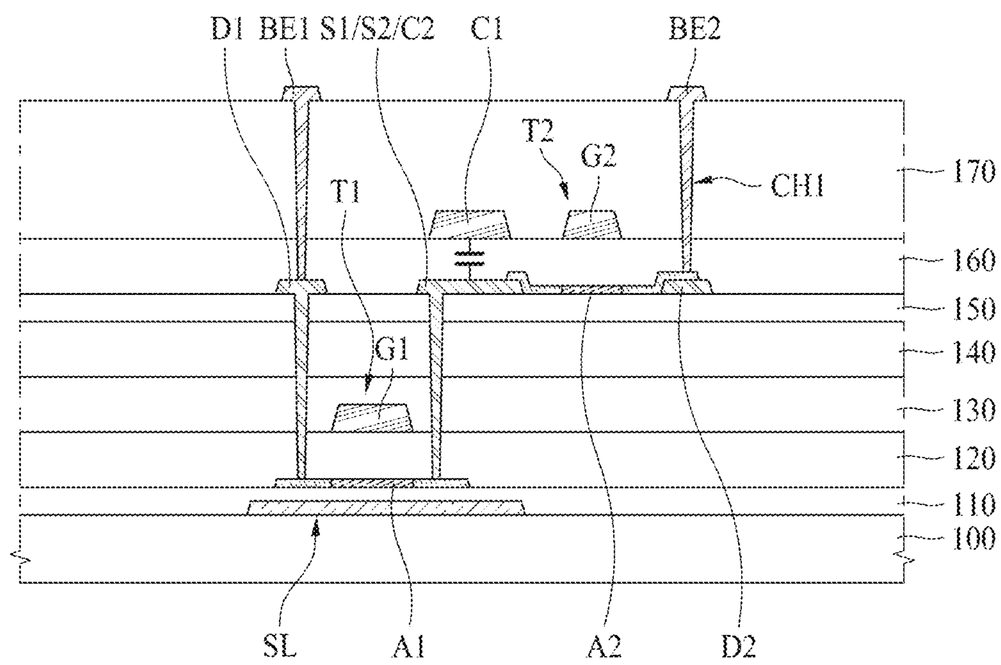
FIG. 19 is a schematic cross-sectional view of a buffer unit of a shift register according to another embodiment of the present disclosure.

FIG. 19 is a schematic cross-sectional view of a buffer unit of a shift register according to another embodiment of the present disclosure.

FIG. 19 is different from FIG. 6 in that a position of the capacitor is changed upward.

Specifically, the first capacitor electrode C1 may be formed of the same material on the same layer as the second gate electrode G2 through the same process. In this case, the first capacitor electrode C1 is connected to the second gate electrode G2, and the first capacitor electrode C1 and the second gate electrode G2 may be integrally formed.

In addition, the second capacitor electrode C2 is formed on the same layer as the first source electrode S1 and the second source electrode S2 while overlapping with the first capacitor electrode C1. The second capacitor electrode C2 may be integrally formed with the first source electrode S1 and the second source electrode S2. Therefore, the capacitor may be constructed by the first capacitor electrode C1 and the second capacitor electrode C2 spaced apart from each other with the sixth insulating layer 160 interposed therebetween.

In FIGS. 6 to 19, a two-stage thin film transistor structure in which the second thin film transistor T2 is formed on the first thin film transistor T1 is illustrated, but present disclosure is not limited thereto, and may include a three-stage thin film transistor structure in which third thin film transistor T3 is additionally formed on the second thin film transistor T2, in some cases, include a fourth-stage or more stage thin film transistor structure.

In addition, the FIGS. 6 to 19 described a case in which the first thin film transistor T1 and the second thin film transistor T2 are connected in parallel to collectively form a pull-up transistor Tu or a pull-down transistor Td. However, present disclosure is not necessarily limited thereto, and according to another embodiment of present disclosure, one of the first thin film transistor T1 and the second thin film transistor T2 may be made of a pull-up transistor Tu, and another may be made of a pull-down transistor Td. In this case, the first drain electrode D1 and the second drain electrode D2 may be electrically insulated from each other, and one of the first drain electrode D1 and the second drain electrode D2 may be electrically connected to a wiring providing a high power voltage VDD, and another may be electrically connected to a wiring providing a low power voltage VSS.

FIG. 20 is a schematic cross-sectional view of a shift register according to another embodiment of the present disclosure.

As shown in FIG. 20, one first GIP circuit may include a plurality of sub-GIP circuits. A plurality of sub-GIP circuits may include a first sub-GIP circuit GIP 1A, a second sub-GIP circuit GIP 1B, a third sub-GIP circuit GIP 1C, and a fourth sub-GIP circuit GIP 1D, and each sub-GIP circuit may include a sub-shift register. For example, according to FIG. 24 to be described later, the first sub-GIP circuit GIP 1A may comprise of a circuit for outputting a gate signal GS, the second sub-GIP circuit GIP 1B may comprise of a circuit for outputting a sensing control signal SENSE, the third sub-GIP circuit GIP 1C may comprise of a circuit for outputting an initialization signal ITIN and the fourth sub-GIP circuit GIP1D may comprise of a circuit for outputting an emission control signal EM.

The number and arrangement of the plurality of sub-GIP circuits GIP 1A, GIP 1B, GIP 1C, and GIP 1D may be variously changed.

According to another embodiment of present disclosure, the second sub-GIP circuit GIP 1B is placed above the first sub-GIP circuit GIP 1A, and the fourth sub-GIP circuit GIP 1D is placed above the third sub-GIP circuit GIP 1C. In addition, the first sub-GIP circuit GIP 1A is placed at the same height as the third sub-GIP circuit GIP 1C, and the second sub-GIP circuit GIP 1B is placed at the same height as the fourth sub-GIP circuit GIP 1D. Accordingly, the shift register area may be reduced.

Figure 21:
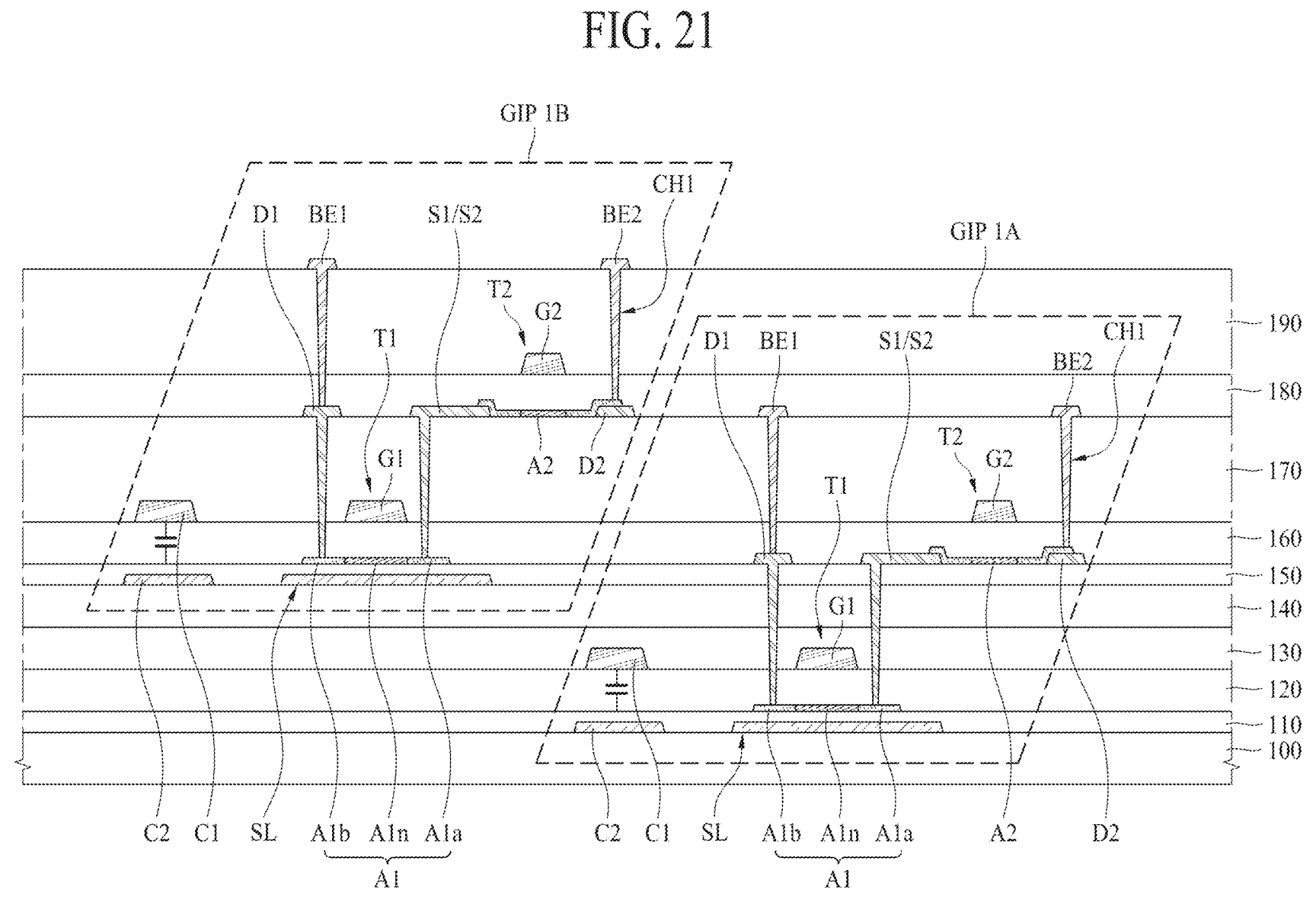

FIG. 21 is a schematic cross-sectional view of a buffer unit of a shift register according to another embodiment of the present disclosure, corresponding to an embodiment in which the second sub-GIP circuit GIP 1B in FIG. 20 is disposed above the first sub-GIP circuit GIP 1A.

As shown in FIG. 21, each of the shift register of the first sub-GIP circuit GIP 1A and the shift register of the second sub-GIP circuit GIP 1B includes a first thin film transistor T1, a second thin film transistor T2, a first capacitor electrode C1, and a second capacitor electrode C2.

The configurations of the first thin film transistor T1, the second thin film transistor T2, the first capacitor electrode C1, and the second capacitor electrode C2 may be variously changed as in the above-described embodiments. In FIG. 21, the first thin film transistor T1, the second thin film transistor T2, the first capacitor electrode C1, and the second capacitor electrode C2 are illustrated in the same manner as FIG. 6, but are not limited thereto.

The configurations of the light blocking layer SL, the first thin film transistor T1, the second thin film transistor T2, the first capacitor electrode C1, and the second capacitor electrode C2 provided in the first sub-GIP circuit GIP 1A is the same as in FIG. 6, and thus a repeated description will be omitted.

To explain the configuration of the second sub-GIP circuit GIP1B, a light blocking layer SL and a second capacitor electrode C2 are provided on the fourth insulating layer 140, a fifth insulating layer 150 is provided on the light blocking layers SL and the second capacitor electrode C2, a first active layer A1 is provided on the fifth insulating layer 150, a sixth insulating layer 160 is provided on the first active layer A1, a first gate electrode G1 and a first capacitor electrode C1 are provided on the sixth insulating layer 160, a seventh insulating layer 170 is sequentially provided on the first gate electrode G1 and the first capacitor electrode, a first source electrode S1 and a first drain electrode D1, and a second source electrode S2 and a second drain electrode D2 are provided on the seventh insulating layer, a second active layer A2 is provided on the first source electrode S1 and the first drain electrode D1, and the second source electrode S2 and the second drain electrode D2, an eighth insulating layer 180 is provided on the second active layer A2, a second gate electrode G2 is provided on the eighth insulating layer 180, a ninth insulating layer 190 is provided on the second gate electrode G2 and a first bridge electrode BE1 and a second bridge electrode BE2 are provided on the ninth insulating layer 190.

As described above, according to embodiment of present disclosure, the first active layer A1 of the second sub-GIP circuit GIP 1B may be formed in the same process as the second active layer A2 of the first sub-GIP circuit GIP 1A, and the first gate electrode G1 of the second sub-GIP circuit GIP1B may be formed in the same process on the same layer as the second gate electrode G2 of the first sub-GIP circuit GIP 1A, accordingly, the process may be simplified while reducing the size of the buffer unit of the shift register.

Figures 22, 23:
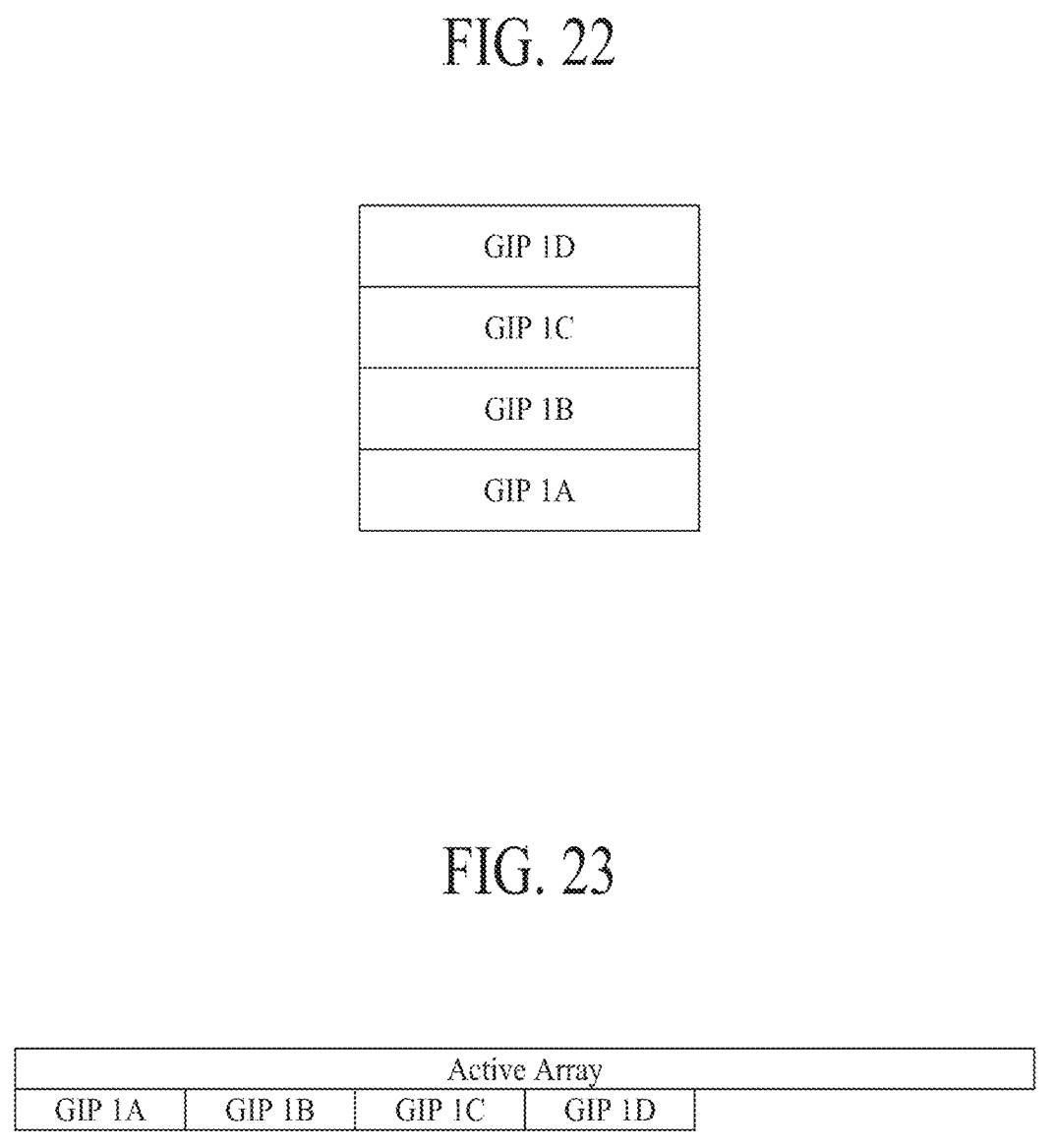

FIG. 22 is a schematic cross-sectional view of a shift register according to another embodiment of the present disclosure. FIG. 22 shows that the arrangement structure of the sub-GIP circuits GIP 1A, GIP 1B, GIP 1C, and GIP 1D is different from that of FIG. 20 described above.

According to another embodiment of present disclosure, the second sub-GIP circuit GIP 1B is placed above the first sub-GIP circuit GIP 1A, the third sub-GIP circuit GIP 1C is placed above the second sub-GIP circuit GIP 1B, and the fourth sub-GIP circuit GIP 1D is placed above the third sub-GIP circuit GIP 1C. Accordingly, the shift register area may be further reduced.

FIG. 23 is a schematic cross-sectional view of a display apparatus according to an embodiment of the present disclosure.

As shown in FIG. 23, a plurality of sub-GIP circuits GIP 1A, GIP 1B, GIP 1C, and GIP 1D may be disposed under an active array including an organic light emitting device. Since the area of the active array may be larger than the area of a plurality of sub-GIP circuits GIP 1A, GIP 1B, GIP 1C, and GIP 1D, a portion of the active array may not overlap a plurality of sub-GIP circuits GIP 1A, GIP 1B, GIP 1C, and GIP 1D.

In this way, according to an embodiment of present disclosure, since the plurality of sub-GIP circuits GIP 1A, GIP 1B, GIP 1C, and GIP 1D are disposed under the active array, the bezel area of the display apparatus may be removed.

Figure 24:
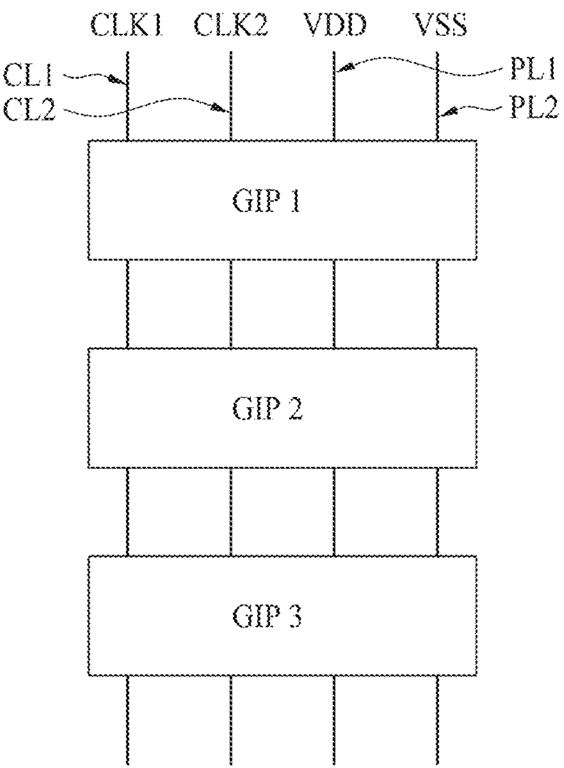
FIG. 24 is a schematic diagram of a GIP circuit area according to an embodiment of the present disclosure.

FIG. 24 is a schematic diagram of a GIP circuit area according to an embodiment of the present disclosure.

As shown in FIG. 24, a plurality of GIP circuits GIP1, GIP2, and GIP3 are arranged vertically, and a plurality of clock lines CL1, CL2 and a plurality of power lines PL1 and PL2 are arranged vertically while overlapping the plurality of GIP circuits GIP1, GIP2, and GIP3.

The plurality of clock lines CL1, CL2 include a first clock line CL1 that transmits the first clock signal CLK1 to the plurality of GIP circuits GIP1, GIP2, and GIP3, and a second clock line CL2 that transmits the second clock signal CLK2 to the plurality of GIP circuits GIP1, GIP2, and GIP3. Although only two clock lines CL1 and CL2 are illustrated in the drawing, the number of clock lines CL1 and CL2 may be three or more.

The plurality of power lines PL1, PL2 include a first power line PL1 that transmits a high power voltage VDD to the plurality of GIP circuits GIP1, GIP2, and GIP3, and a second power line PL2 that transmits a low power voltage VSS to the plurality of GIP circuits GIP1, GIP2, and GIP3.

In this way, the bezel area of the display apparatus can be reduced because the plurality of clock lines CL1, CL2 and the plurality of power lines PL1, PL2 are formed to overlap with the plurality of GIP circuits GIP1, GIP2, and GIP3.

Figure 25:
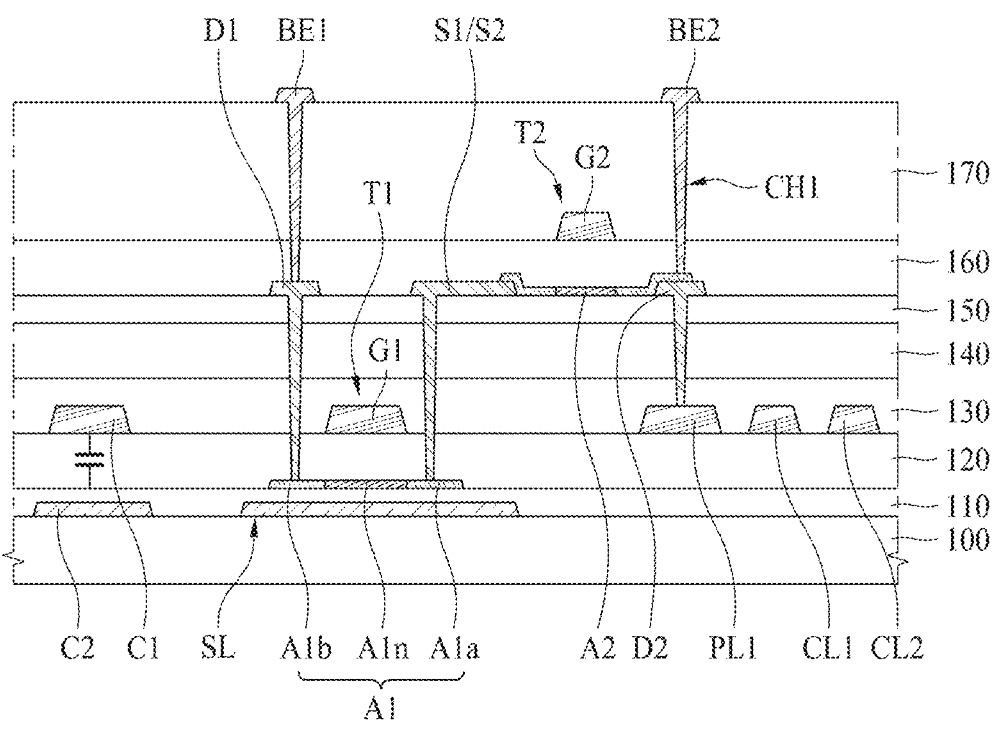
FIG. 25 is a cross-sectional view of a buffer unit of a shift register according to another embodiment of the present disclosure.

FIG. 25 is a cross-sectional view of a buffer unit of a shift register according to another embodiment of the present disclosure, which corresponds to the GIP circuit area of FIG. 24. The following embodiments of FIGS. 26 to 28 correspond to the GIP circuit area of FIG. 24.

The buffer unit according to FIG. 25 is different from the buffer unit according to FIG. 6 in that the first power line PL1 and the clock lines CL1 and CL2 are added. Therefore, hereinafter, only a configuration different from that of FIG. 6 will be described.

As shown in FIG. 25, a first power line PL1 and clock lines CL1 and CL2 are provided on a layer that is under the second active layer A2 of the second thin film transistor T2. That is, the first power line PL1 and clock lines CL1 and CL2 are closer to the substrate 100 than the second active layer A2. The first power line PL1 and the clock lines CL1 and CL2 may be formed of the same material on the same layer, for example, the same material on the same layer as the first gate electrode G1 of the first thin film transistor T1, and in this case, the process may be simplified.

The first power line PL1 may be electrically connected to the second drain electrode D2 of the second thin film transistor T2. For example, the second drain electrode D2 may be connected to the first power line PL1 through a contact hole provided in the third to fifth insulating layers 130, 140, and 150.

Since the second drain electrode D2 is connected to the first power line PL1 that transmits the high power voltage VDD, the first thin film transistor T1 and the second thin film transistor T2 are connected in parallel to collectively form a pull-up transistor Tu.

Although not illustrated, when the first thin film transistor T1 and the second thin film transistor T2 are connected in parallel with each other to collectively form a pull-down transistor Td, the second power line PL2 in FIG. 24 may be connected to the second source electrode S2 to apply a low power voltage VSS to the second source electrode S2.

Figure 26:
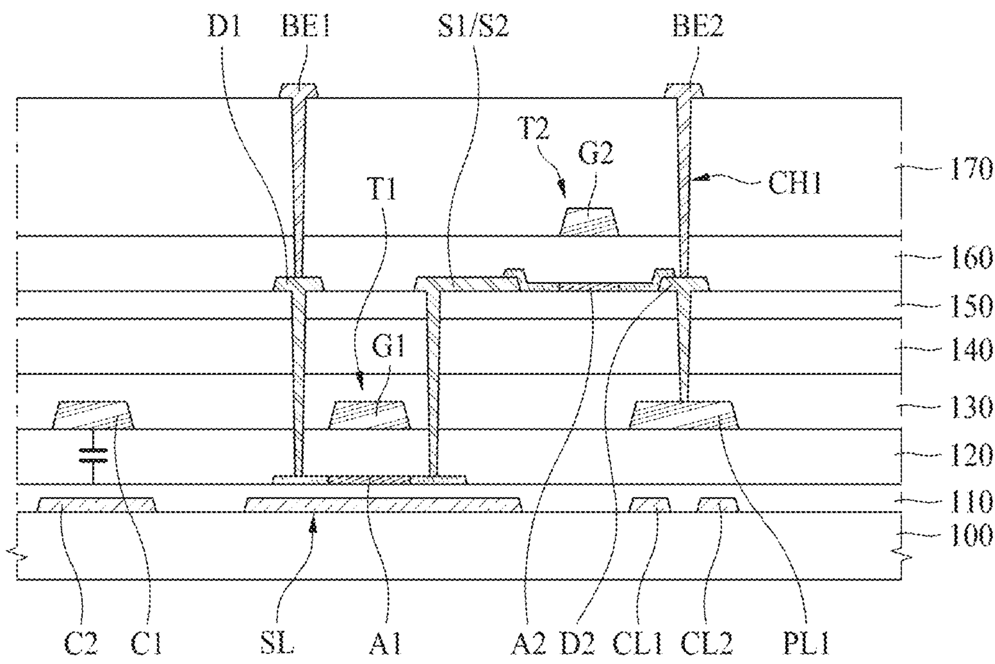
FIG. 26 is a cross-sectional view of a buffer unit of a shift register according to another embodiment of the present disclosure.

FIG. 26 is a cross-sectional view of a buffer unit of a shift register according to another embodiment of the present disclosure, which is different from the buffer unit according to FIG. 25 in that the formation position of the clock lines CL1 and CL2 is changed. Therefore, hereinafter, only a configuration different from that of FIG. 25 will be described.

As shown in FIG. 26, the clock lines CL1 and CL2 are formed under the first power line PL1. That is, the clock lines CL1 and CL2 are closer to the substrate 100 than the first power line PL1. For example, the clock lines CL1 and CL2 may be formed of the same material on the same layer as the light blocking layer SL and the second capacitor electrode C2 through the same process.

In addition, at least a portion of the clock lines CL1 and CL2 may overlap the first power line PL1.

In this way, since the clock lines CL1 and CL2 are formed under the first power line PL1, the clock swing signal of the clock lines CL1 and CL2 can be shielded by the first power line PL1.

Figure 27:
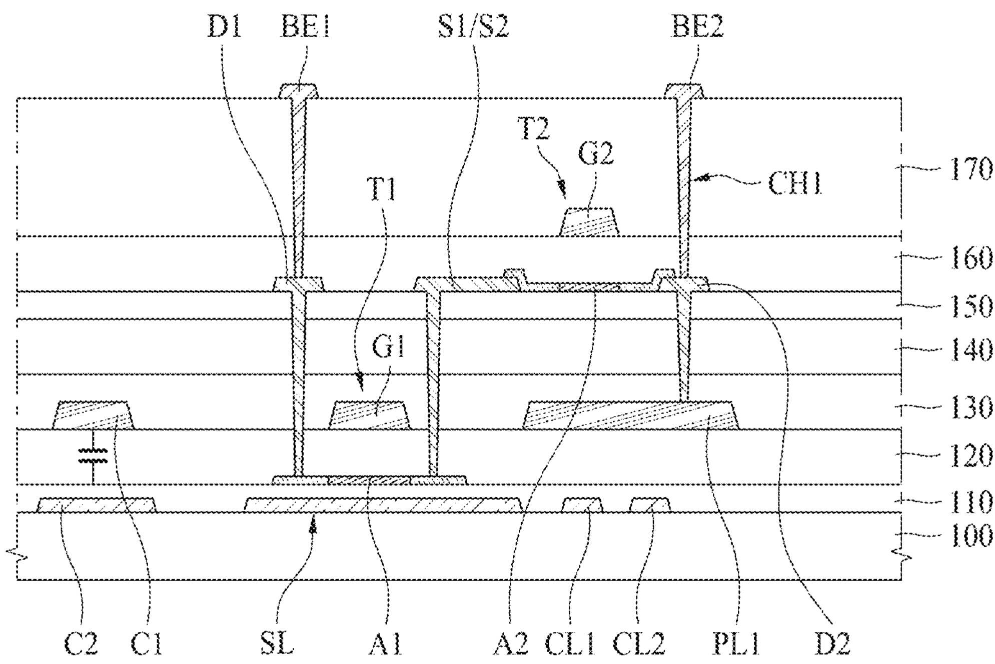
FIG. 27 is a cross-sectional view of a buffer unit of a shift register according to another embodiment of the present disclosure.

FIG. 27 is a cross-sectional view of a buffer unit of a shift register according to another embodiment of the present disclosure, which is different from the buffer unit according to FIG. 26 in that the first power line PL1 is additionally extended below the second active layer A2. That is, the first power line PL1 is closer to the substrate 100 than the second active layer A2. Therefore, hereinafter, only a configuration different from that of FIG. 26 will be described.

As shown in FIG. 27, the first power line PL1 may extend below the second active layer A2 and thus may overlap the channel part of the second active layer A2. Accordingly, external light entering the channel part of the second active layer A2 may be blocked by the first power line PL1.

On the other hand, although not illustrated, in the embodiment of FIG. 25, the first power line PL1 may extend below the second active layer A2 and may overlap the channel part of the second active layer A2.

Figure 28:
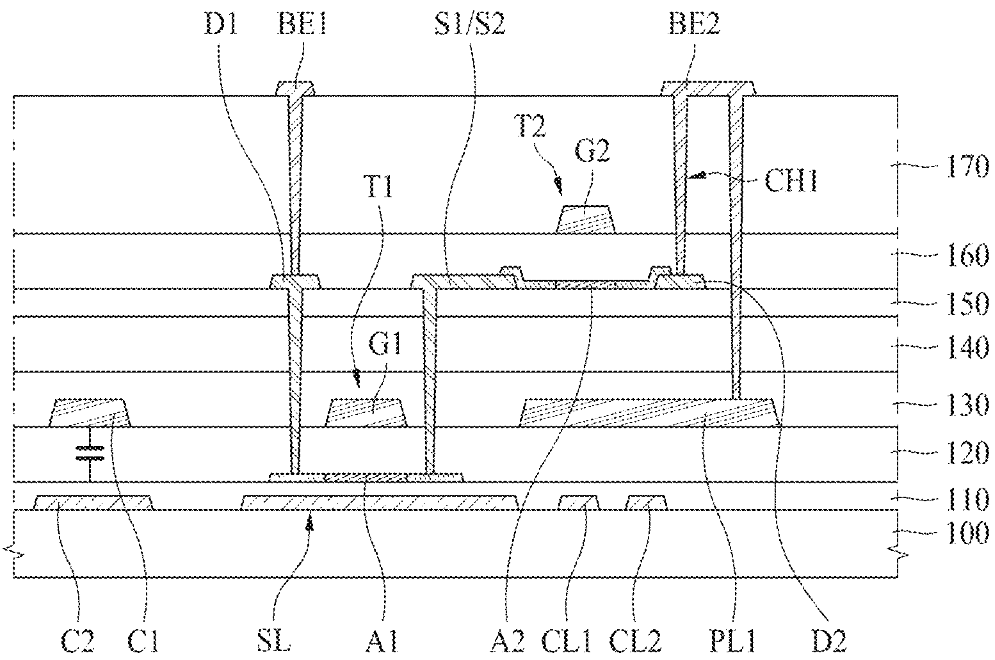
FIG. 28 is a cross-sectional view of a buffer unit of a shift register according to another embodiment of the present disclosure.

FIG. 28 is a cross-sectional view of the buffer unit of the shift register according to another embodiment of present disclosure, which is different from the buffer unit according to FIG. 27 in that the first power line PL1 is not connected to the second drain electrode D2 but is connected to the second bridge electrode BE2. Therefore, hereinafter, only a configuration different from that of FIG. 27 will be described.

As shown in FIG. 28, the second bridge electrode BE2 is connected to the first power line PL1 through a contact hole provided in the third to seventh insulating layers 130, 140, 150, 160, and 170. Therefore, the first power line PL1 may be electrically connected to the second drain electrode D2 through the second bridge electrode BE2 and the second connection part of the second active layer A2.

Meanwhile, although not illustrated, in the embodiments of FIGS. 25 and 26 described above, the first power line PL1 may not be connected to the second drain electrode D2 but may be connected to the second bridge electrode BE2.

The above embodiments of FIGS. 25 to 28 are applied to the first thin film transistor T1 and the second thin film transistor T2 according to FIG. 6, but are not limited thereto. As the first thin film transistor T1 and the second thin film transistor T2 according to the various embodiments described above are applied, the first power line PL1 and the clock lines CL1 and CL2 according to the embodiments of FIGS. 25 to 28 may be applied.

Accordingly, the present disclosure may have the following advantages.

According to one embodiment of present disclosure, the first thin film transistor is placed in a lower side near the substrate, and the second thin film transistor is placed in an upper side far above the substrate, making it easier to place a plurality of the thin film transistors in the buffer unit of the shift register, reducing the size of the gate-in panel structure.

According to an embodiment of present disclosure, since a second active layer of a second thin film transistor is directly connected to the second source electrode or the second drain electrode already provided in the lower side, the heat treatment process when the second source electrode or the second drain electrode is formed does not affect the second active layer, so that, high mobility characteristics of the second active layer may be prevented from being degraded and low power driving may be performed.

According to an embodiment of present disclosure, the lower end of the connection electrode is in contact with the upper surface of the first active layer of the first thin film transistor, and the side and upper surface of the connection electrode are in contact with the lower surface of the second active layer of the second thin film transistor so that, the second thin film transistor and the first thin film transistor may be electrically connected to each other by one connection electrode, thereby reducing the number of contact holes and the number of masks for pattern formation, thereby optimizing the process.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A thin film transistor substrate comprising:

a substrate;

a first thin film transistor on the substrate, the first thin film transistor including a first active layer and a first gate electrode;

a second thin film transistor on the substrate, the second thin film transistor including a second active layer and a second gate electrode above the first active layer and the first gate electrode;

a first insulating layer between the first gate electrode and the second active layer;

a second insulating layer between the second active layer and the second gate electrode; and a first connection electrode connecting together the first active layer and the second active layer, the first connection electrode extending through a first contact hole in the first insulating layer and is in contact with each of the first active layer and the second active layer, wherein a top of the first connection electrode is provided under the second insulating layer, wherein the first connection electrode comprises a second source electrode of the second thin film transistor or the second active layer of the second thin film transistor.

2. The thin film transistor substrate according to claim 1, wherein a portion of a lower surface of the second active layer is in contact with a side surface and a portion of an upper surface of the first connection electrode.

3. The thin film transistor substrate according to claim 1, wherein an end of the second active layer is in contact with a side surface of the first connection electrode.

4. The thin film transistor substrate according to claim 1, wherein the second active layer is in contact with a first side of the first connection electrode, a second side of the first connection electrode that is opposite the first side, and an upper surface of the first connection electrode that is between the first side and the second side of the first connection electrode.

5. The thin film transistor substrate according to claim 1, wherein the second thin film transistor further comprises:

a second drain electrode in contact with the second active layer, wherein a first side of the second active layer is in contact with the first connection electrode, and a second side of the second active layer that is opposite the first side of the second active layer is in contact with the second drain electrode, and an overlapping structure between the first side of the second active layer and the first connection electrode is different from an overlapping structure between the second side of the second active layer and the second drain electrode.

6. The thin film transistor substrate according to claim 1, wherein each of the first active layer and the second active layer includes a channel part and a connection part connected to a side of the channel part, the connection part having an electrical conductivity that is greater than an electrical conductivity of the channel part, and the first connection electrode is in contact with the connection part of the first active layer and the connection part of the second active layer.

7. The thin film transistor substrate according to claim 1, wherein the second active layer includes a channel part and a connection part connected to a side of the channel part, the connection part having an electrical conductivity that is greater than an electrical conductivity of the channel part, and the first connection electrode is the connection part.

8. The thin film transistor substrate according to claim 1, further comprising:

a second source electrode in contact with an upper surface of the first connection electrode.

9. The thin film transistor substrate according to claim 1, wherein the second thin film transistor further comprises:

a second drain electrode in contact with the second active layer and the thin film transistor substrate further comprising:

a bridge electrode on the second insulating layer, the bridge electrode electrically connected to the second drain electrode of the second thin film transistor through a second contact hole in the second insulating layer.

10. The thin film transistor substrate according to claim 9, wherein the second contact hole overlaps the bridge electrode and the second drain electrode, and the second contact hole is non-overlapping with the second active layer.

11. The thin film transistor substrate according to claim 9, wherein the second contact hole overlaps the bridge electrode, the second drain electrode, and the second active layer.

12. The thin film transistor substrate according to claim 1, further comprising:

a first capacitor electrode electrically connected to the second gate electrode and the first capacitor electrode on a same layer as the second gate electrode; and a second capacitor electrode on a same layer as the first connection electrode.

13. The thin film transistor substrate according to claim 1, wherein the first gate electrode, the second gate electrode, the first active layer, and the second active layer overlap each other.

14. The thin film transistor substrate according to claim 1, wherein a gate driver and an active array are on the substrate, the active array is farther from the substrate than the gate driver and the active array overlaps the gate driver, the gate driver includes a shift register including a pull-up transistor configured to output a gate-on signal and a pull-down transistor configured to output a gate-off signal, and the first thin film transistor and the second thin film transistor are connected in parallel to collectively form the pull-up transistor, or the first thin film transistor and the second thin film transistor are connected in parallel to collectively form the pull-down transistor.

15. A display apparatus comprising:

a substrate;

a first thin film transistor on the substrate, the first thin film transistor including a first active layer and a first gate electrode;

a second thin film transistor on the substrate and including a second active layer and a second gate electrode, the second active layer electrically connected to the first active layer and farther from the substrate than the first active layer and the second gate electrode farther from the substrate than the first gate electrode;

a first insulating layer between the first gate electrode and the second active layer;

a second insulating layer between the second active layer and the second gate electrode;

a first connection electrode connecting together the first active layer and the second active layer; and one or more pixels on the substrate, the one or more pixels configured to emit light, wherein a top of the first connection electrode is under the second insulating layer, wherein the first connection electrode comprises a second source electrode of the second thin film transistor or the second active layer of the second thin film transistor.

16. The display apparatus according to claim 15, wherein the first connection electrode extends through a contact hole in the first insulating layer and in contact with each of the first active layer and the second active layer.

* * * * *